(12) United States Patent
Kudo et al.

(10) Patent No.: US 8,870,588 B2
(45) Date of Patent: Oct. 28, 2014

(54) CONNECTOR AND LIGHTING DEVICE

(75) Inventors: Takaaki Kudo, Tokyo (JP); Kenichi Shimoji, Tokyo (JP)

(73) Assignee: Japan Aviation Electronics Industry, Limited, Tokyo (JP)

( * ) Notice: Subject to any disclaimer, the term of this patent is extended or adjusted under 35 U.S.C. 154(b) by 0 days.

(21) Appl. No.: 13/510,703

(22) PCT Filed: Sep. 28, 2010

(86) PCT No.: PCT/JP2010/066823
§ 371 (c)(1),
(2), (4) Date: May 18, 2012

(87) PCT Pub. No.: WO2011/061997
PCT Pub. Date: May 26, 2011

(65) Prior Publication Data
US 2012/0264326 A1    Oct. 18, 2012

(30) Foreign Application Priority Data

Nov. 20, 2009  (JP) .................................. 2009-265508
Jul. 22, 2010  (JP) .................................. 2010-164772

(51) Int. Cl.
*H01R 13/64*    (2006.01)
*H01R 12/57*    (2011.01)
(Continued)

(52) U.S. Cl.
CPC . *H01R 12/57* (2013.01); *F21V 3/00* (2013.01); *H01R 13/41* (2013.01); *H01R 13/73* (2013.01); *F21K 9/00* (2013.01); *H01R 12/75* (2013.01); *F21V 19/0055* (2013.01); *F21Y 2101/02* (2013.01); *H01R 12/716* (2013.01); *H05K 2201/09063* (2013.01); *F21V 23/06* (2013.01)
USPC ......................................................... 439/375

(58) Field of Classification Search
USPC ................... 439/375, 65, 637, 630, 638, 374, 439/377–378
See application file for complete search history.

(56) References Cited

U.S. PATENT DOCUMENTS 4,692,120 A * 9/1987 Feinstein .......................... 439/62
5,455,742 A * 10/1995 Phoy et al. ..................... 361/778
(Continued)

FOREIGN PATENT DOCUMENTS

| JP | 4-136876 A | 5/1992 |
|---|---|---|
| JP | 6-11283 U | 2/1994 |
| JP | 8-264239 A | 10/1996 |
| JP | 11-176539 A | 7/1999 |

OTHER PUBLICATIONS

International Search Report dated Oct. 26, 2010 issued in International Appln. No. PCT/JP2010/066823.

*Primary Examiner* — Jean F Duverne
(74) *Attorney, Agent, or Firm* — Holtz, Holtz, Goodman & Chick PC

(57) ABSTRACT

A connector has contacts, each including a holding portion inserted from a direction orthogonal to a connector fitting direction and held by a housing, a contact portion continuous with the holding portion and extending in the fitting direction, and a connection portion continuous with the holding portion and connected to an LED mounting substrate. The housing includes a main body inserted in a hole formed in the LED mounting substrate, and a top board portion formed thereon. The main body is formed with connector receiving portions which accommodate the contact portions and receive a cable connector. The board portion is formed with contact accommodating portions which communicate with the connector receiving portions and accommodate the holding portions. The main body is formed with slots via which the contacts are inserted into the connector receiving portions and the contact accommodating portions from directions orthogonal to the fitting direction.

40 Claims, 35 Drawing Sheets

(51) Int. Cl.
  F21K 99/00   (2010.01)
  H01R 12/71   (2011.01)
  F21V 23/06   (2006.01)
  *F21V 3/00*      (2006.01)
  *H01R 13/41*     (2006.01)
  *H01R 13/73*     (2006.01)
  *H01R 12/75*     (2011.01)
  *F21V 19/00*     (2006.01)
  *F21Y 101/02*    (2006.01)

(56) References Cited

U.S. PATENT DOCUMENTS

| | | | |
|---|---|---|---|
| 5,525,072 A | | 6/1996 | Kunishi |
| 6,004,140 A * | | 12/1999 | Kato et al. ............... 439/65 |
| 6,612,866 B2 * | | 9/2003 | Germer et al. ............ 439/517 |
| 6,986,671 B2 * | | 1/2006 | Margulis et al. ........... 439/78 |
| 7,258,569 B1 * | | 8/2007 | Johnson et al. ............ 439/378 |
| 7,789,677 B2 * | | 9/2010 | Yang et al. ............... 439/83 |

* cited by examiner

CONNECTOR AND LIGHTING DEVICE

This application is a U.S. National Phase Application under 35 USC 371 of International Application PCT/JP2010/066823 filed Sep. 28, 2010.

TECHNICAL FIELD

The present invention relates to a connector and a lighting device using the connector.

BACKGROUND ART

Conventionally, there has been proposed a connector which is surface-mounted on a circuit board (see Patent Literature 1).

The above-mentioned connector comprises a plurality of contacts, and a housing that holds the contacts.

The contacts each include a fork-shaped contact portion and a base portion which is continuous with the contact portion.

The housing has a central portion formed with contact receiving openings (holes each of which linearly passes through the central portion of the housing). The contact portion and the base portion of each contact are inserted through an associated one of the contact receiving openings, and the base portion of each contact is held by an inner wall of the associated one of the contact receiving openings of the housing.

CITATION LIST

Patent Literature

[PTL 1] Japanese Utility Model Application Publication (Kokai) No. H04-136876 (see paragraphs 0010 and 0011, FIG. 3)

SUMMARY OF THE INVENTION

Technical Problem

In the above-described connector, a direction of inserting the base portion of each contact into the associated one of the contact receiving holes of the housing is the same as a longitudinal direction of the contact portion of each contact, and hence the housing is larger in dimension in a fitting direction (dimension in a direction of inserting the connector into a connector accommodating hole of the circuit board).

Therefore, when a central part of the housing is inserted into the connector accommodating hole of the circuit board, a front end portion of the central part of the housing largely protrudes from one surface of the circuit board, and a rear end portion of the central part of the housing and wing parts of the housing largely protrude from the other surface of the circuit board. Further, a solder connection portion of each contact protrudes from the housing. As a result, there arises, for example, the following problem:

For example, when the above-mentioned connector is used as a connector for a lighting device using LEDs (light emitting diodes), there is a problem that lights emitted from the LEDs mounted on the other surface of the circuit board are blocked by the rear end portion of the central part of the housing and the wing parts of the housing, and hence when the lighting device in the on state is viewed, a portion thereof where the connector is located appears darker than other portions.

The present invention has been made in view of these circumstances, and an object thereof is to reduce a dimension of a portion of a connector protruding from a surface of a substrate.

Solution of Problem

As a solution to the above problem, the present invention provides a connector mounted on a substrate, for being fitted to a mating connector, the connector including a housing, and a contact which is inserted into and held by the housing, wherein the housing includes a housing main body which is inserted in an inserted portion formed in the substrate, and a top board portion formed on the housing main body, wherein the contact includes a holding portion which is inserted into the housing from a predetermined direction parallel to an upper surface of the top board portion, and is held by the housing, a contact portion which is continuous with the holding portion and extends in a connector fitting direction, and a connection portion which is continuous with the holding portion and is connected to the substrate, wherein the housing main body has a connector receiving portion formed therein which accommodates the contact portion and receives the mating connector, wherein the top board portion has a contact accommodating portion formed therein which communicates with the connector receiving portion and accommodates the holding portion, and wherein the housing main body has a slot formed therein via which the contact is inserted into the connector receiving portion and the contact accommodating portion, from the predetermined direction.

With the arrangement of the connector according to the present invention, the holding portion of the contact is inserted into the housing from the predetermined direction parallel to the upper surface of the top board portion, and hence it is possible to reduce a dimension of the housing in the fitting direction.

Preferably, when the top board portion is viewed from above, the contact almost in its entirety is covered by the top board portion.

Preferably, when the housing main body is inserted in the inserted portion, the housing main body protrudes downward from a lower surface of the substrate, and a lower surface of the top board portion is opposed to an upper surface of the substrate.

Preferably, when the housing main body is inserted in the inserted portion, the upper surface of the top board portion becomes parallel to the upper surface of the substrate.

Preferably, the connector fitting direction is a direction orthogonal to the upper surface of the top board portion.

The invention provides a connector in which the connector fitting direction is a direction parallel to the upper surface of the top board portion.

Preferably, the housing is integrally formed of a white or white based colored resin.

The light device according to the invention includes the connector described above.

The above and other objects, features and advantages of the present invention will become more apparent from the following detailed description taken in conjunction with the accompanying drawings.

Advantageous Effects of Invention

According to the present invention, it is possible to reduce the dimension of the portion of the connector protruding from the surface of the substrate.

BEST MODE FOR CARRYING OUT THE INVENTION

Hereafter, embodiments of the present invention will be described.

First, a description will be given of a connector according to a first embodiment of the invention with reference to FIGS. 1 to 9.

Figure 6:
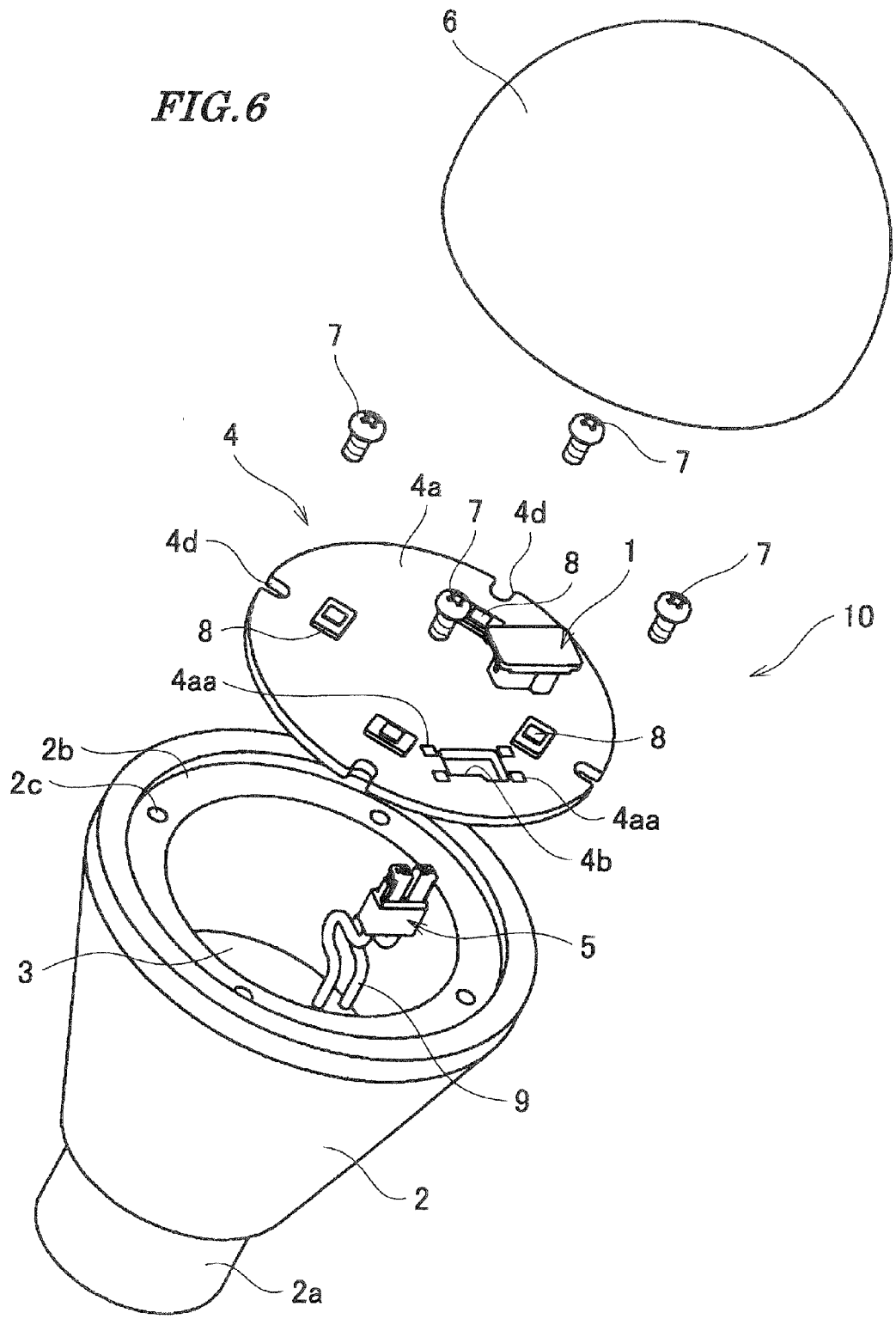
FIG. 6 is an exploded perspective view of an LED bulb using the connector shown in FIG. 1.
Figure 7:
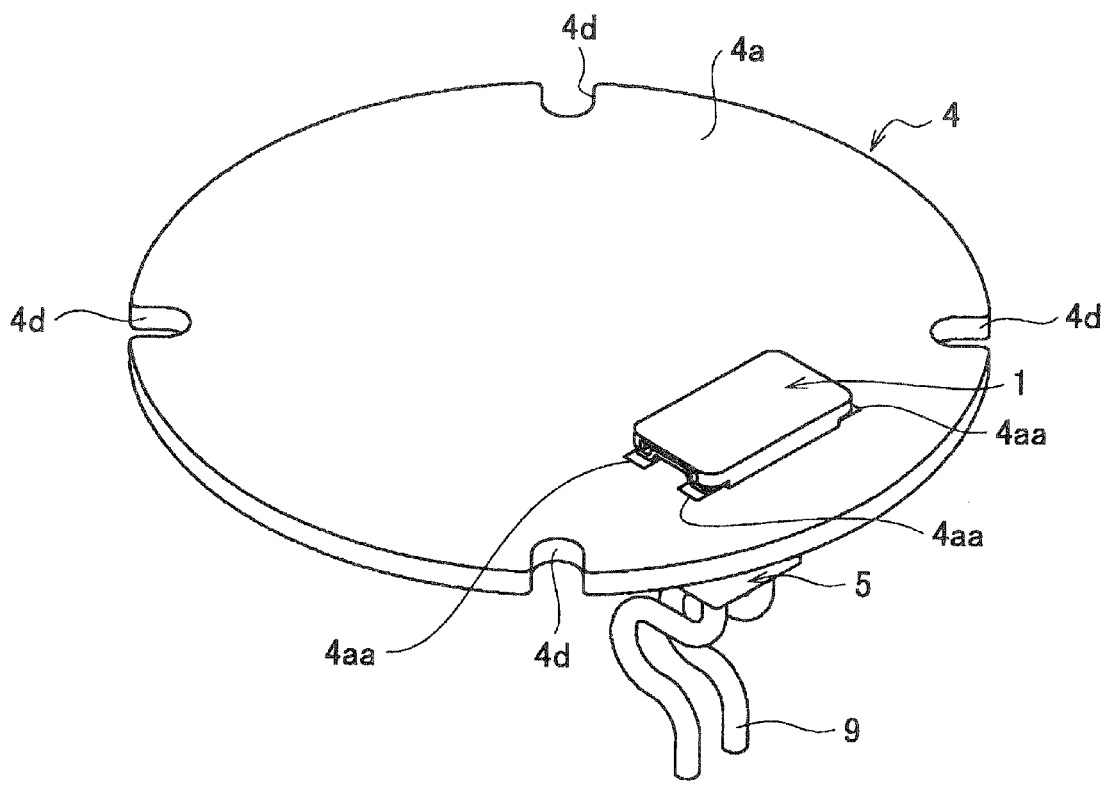
FIG. 7 is a perspective view of an LED mounting substrate of the LED bulb shown in FIG. 6, taken obliquely from above.
Figure 8:
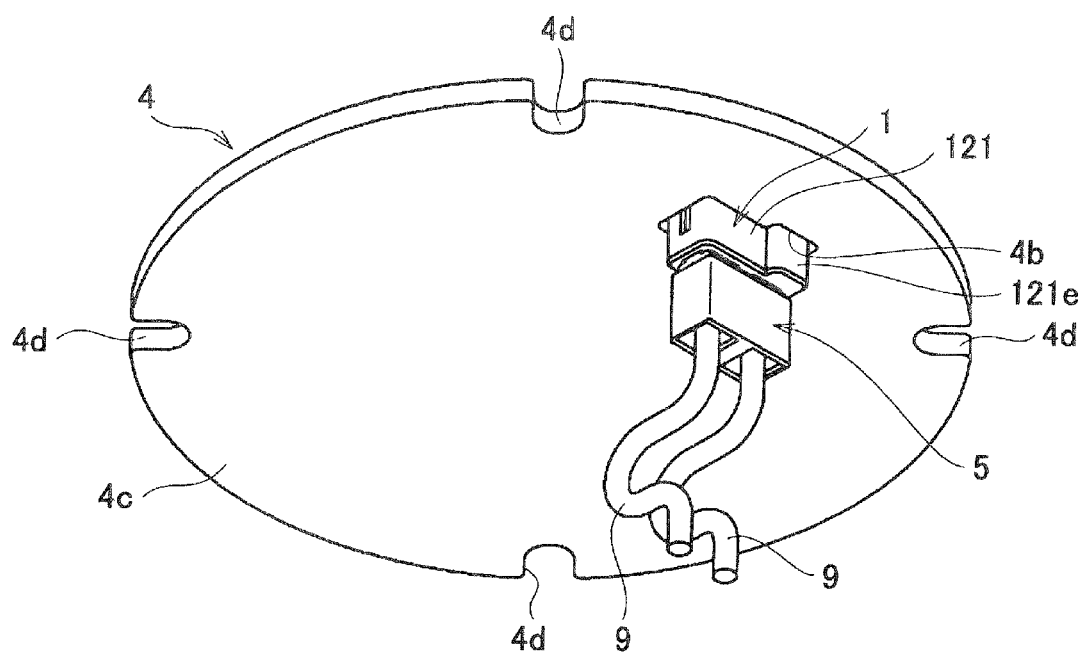
FIG. 8 is a perspective view of the LED mounting substrate of the LED bulb shown in FIG. 6, taken obliquely from below.

FIG. 6 is an exploded perspective view of an LED bulb (lighting device) 10, and a connector 1 according to the first embodiment is used for the LED bulb 10.

The LED bulb 10 comprises a housing 2, a power board 3 and an LED mounting substrate (substrate) 4 which are accommodated in the housing 2, the connector 1 which is mounted on the LED mounting substrate 4, a cable connector (mating connector) 5 which is fitted to the connector 1, and a bulb cover 6 which is fitted on a front end portion of the housing 2.

The housing 2 has a bulb base 2a mounted on a rear end thereof.

The power board 3 is a converter board that converts electric power from alternating current to direct current.

The LED mounting substrate 4 is substantially disk-shaped. The LED mounting substrate 4 is formed by laminating e.g. aluminum plates. As a material of the LED mounting substrate 4, not only aluminum, but also ceramics, such as alumina, may be used. The LED mounting substrate 4 is fixed to the housing 2 with a plurality of screws 7. A plurality of LEDs 8 are mounted on an upper surface 4a (surface on which the LEDs 8 are mounted) of the LED mounting substrate 4 at equally-spaced intervals in a circumferential direction. The LED mounting substrate 4 is formed with one hole (inserted portion) 4b for having a housing main body 121 (see FIGS. 1 and 2) of a housing 12 of the connector 1, described hereinafter, inserted therein. The hole 4b has a shape corresponding to a transverse cross-sectional shape of the housing main body 121 of the connector 1, and a size for receiving the housing main body 121. The LED mounting substrate 4 has an outer periphery thereof formed with four cutouts 4d for passing the screws 7, respectively, which are arranged at equally-spaced intervals in a circumferential direction.

The bulb cover 6 has a hemispherical shape. The bulb cover 6 is fixed to the front end portion of the housing 2. A space over the LED mounting substrate 4 is covered with the bulb cover 6.

Figure 9:
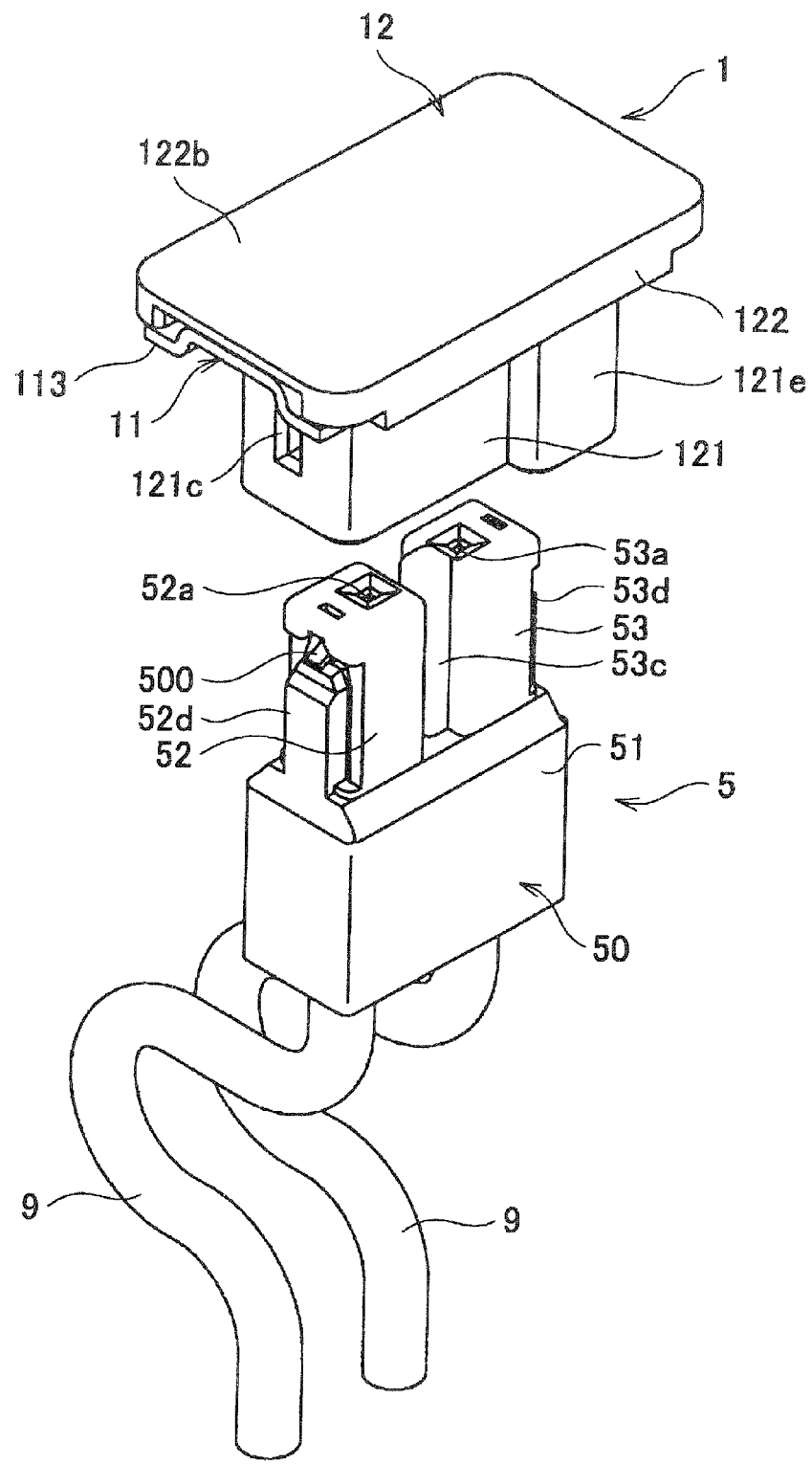
FIG. 9 is a perspective view of the connector shown in FIG. 1 and a cable connector which is fitted to this connector.
Figure 10:
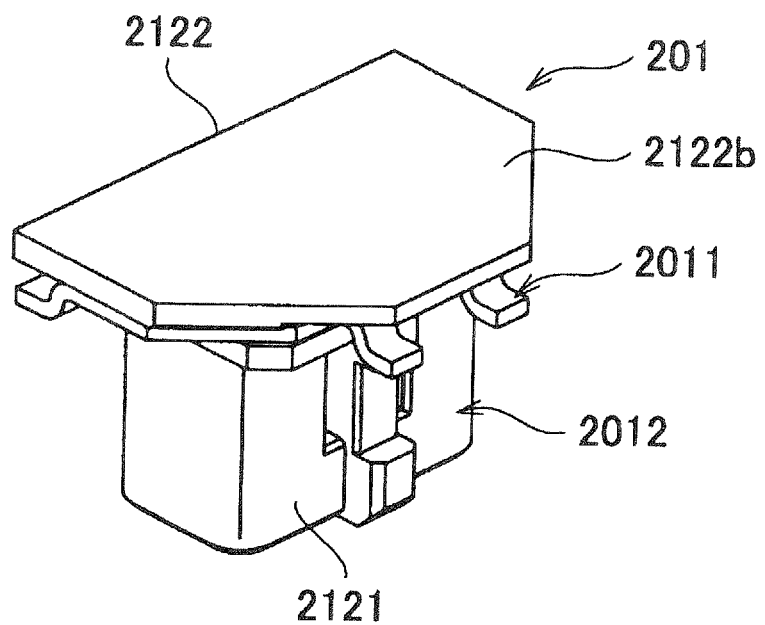
FIG. 10 is a perspective view of a connector according to a second embodiment of the present invention, taken obliquely from above.
Figure 11:
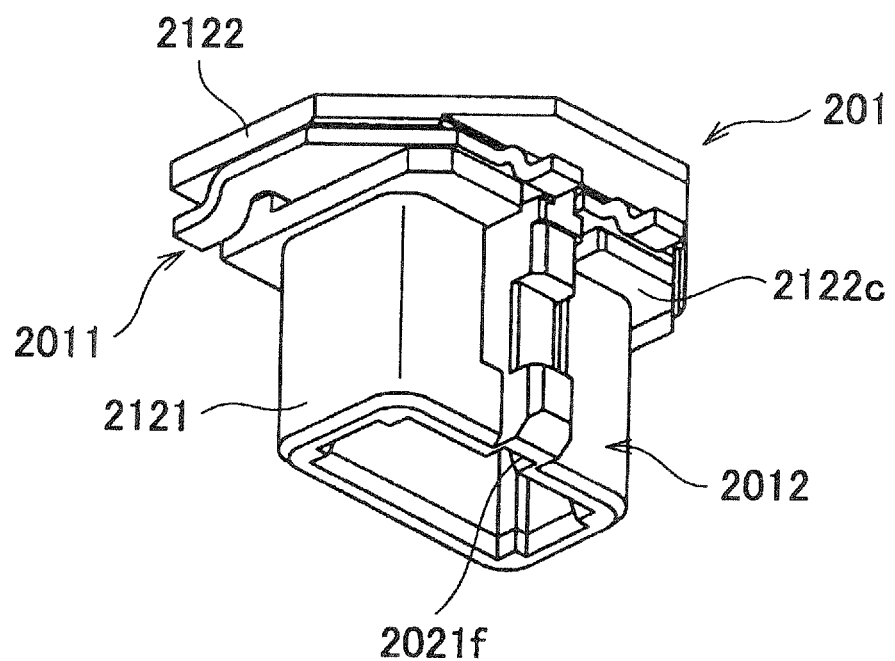
FIG. 11 is a perspective view of the connector shown in FIG. 10, taken obliquely from below.
Figure 12:
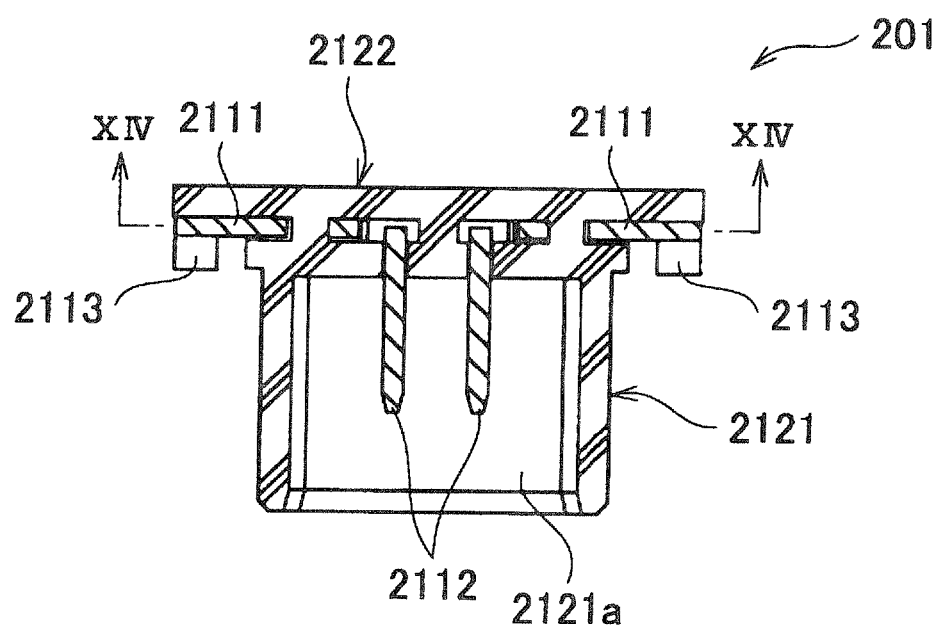
FIG. 12 is a longitudinal cross-sectional view of the connector shown in FIG. 10.

As shown in FIG. 9, the cable connector 5 includes a housing 50. The housing 50 is formed with an accommodating portion (not shown) which accommodates one ends of cables 9 and contacts (not shown) mounted on the respective one ends of the cables 9. The housing 50 includes a box-shaped housing main body 51, and two hollow prism-shaped fitting portions 52 and 53 which are continuous with the housing main body 51. The fitting portions 52 and 53 have holes 52a and 53a formed in front ends thereof, respectively, for having contact portions 112 of contacts 11, described hereinafter, received therein, respectively. The fitting portion 53 is formed with a key 53c which is fitted in a key groove 121f (see FIG. 2), described hereinafter, of the housing main body 121 of the connector 1 on a side surface thereof so as to ensure connection of same polarity portions. The key 53c protrudes toward the fitting portion 52. Note that the other ends of the cables 9 are connected to the power board 3. Further, by arranging the plurality of LEDs 8 as a bridge circuit, it is possible to extend the cables 9 out of the bulb base 2a without using the power board 3. The fitting portions 52 and 53 include lances 52d and 53d, respectively. Parts 500 (see FIG. 9) of the contacts mounted on the one ends of the cables 9 are exposed from respective locations close to the front ends of the lances 52d and 53d.

As shown in FIGS. 1 to 4, the connector 1 comprises the two contacts 11, and the housing 12 that holds these contacts 11. The two contacts 11 are of the same type, and are point-symmetrically arranged in the housing 12 (see FIG. 5).

The housing 12 includes the box-shaped housing main body 121 which is inserted in the hole 4b of the LED mounting substrate 4, and a planar plate-shaped top board portion 122 which is continuous with the housing main body 121. The housing 12 is integrally molded e.g. of a white resin.

The contacts 11 each include a planar plate-shaped holding portion 111 held by the top board portion 122, the contact portion 112, which is pin-shaped and continuous with the holding portion 111, and extends in a direction D1 of fitting the connector (see FIG. 2), and L-shaped connection portions 113 which are continuous with the holding portion 111 and are each soldered to an associated one of lands 4aa (see FIG. 6) of the LED mounting substrate 4. The holding portion 111 has a protrusion 111a. When the holding portion 111 is inserted in an associated one of contact accommodating portions 122a, described hereinafter, of the housing 12, the protrusion 111a bites into an inner wall surface of the associated one of the contact accommodating portions 122a of the housing 12 (see FIG. 5).

Each contact 11 is formed by blanking and bending one metal plate.

The housing main body 121 is formed with connector receiving portions 121a and 121b that accommodate the contact portions 112 of the contacts 11, respectively, and receive the cable connector 5.

The top board portion 122 is formed with the contact accommodating portions 122a that communicate with the connector receiving portions 121a and 121b, and each accommodate at least the holding portion 111 of each contact 11.

Figure 2:
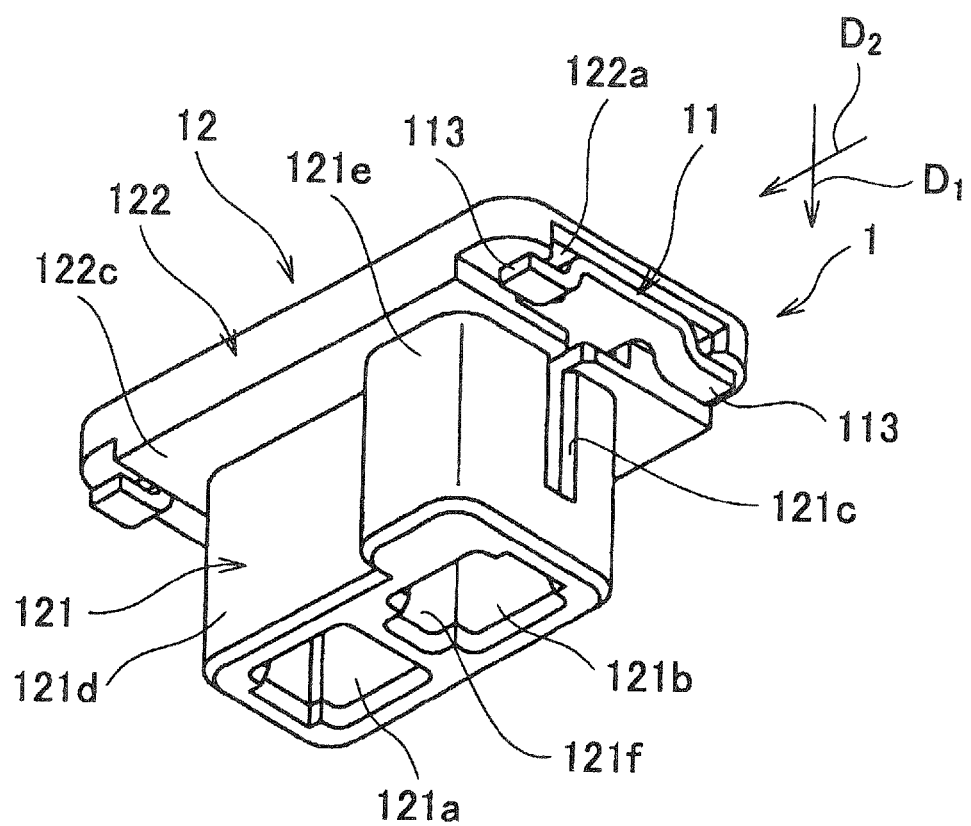
FIG. 2 is a perspective view of the connector shown in FIG. 1, taken obliquely from below.
Figure 3:
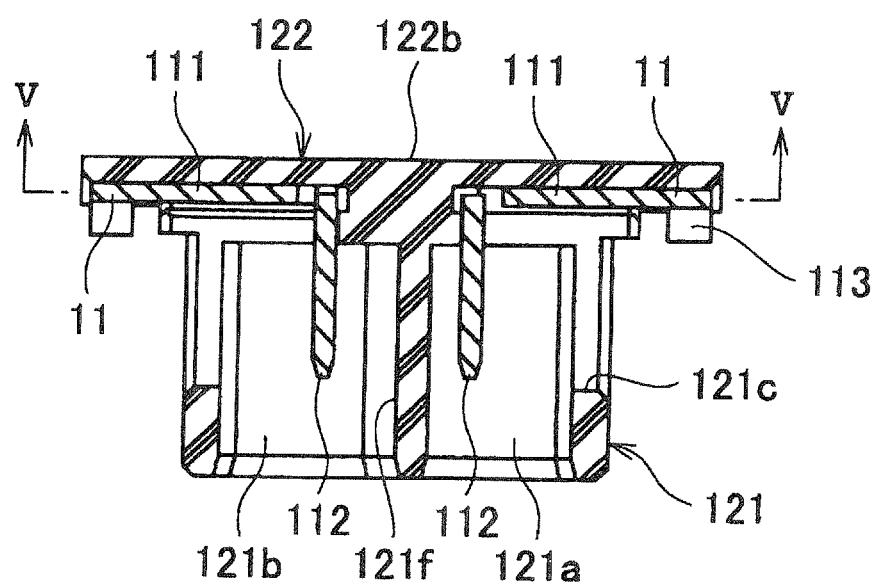
FIG. 3 is a longitudinal cross-sectional view of the connector shown in FIG. 1.
Figure 4:
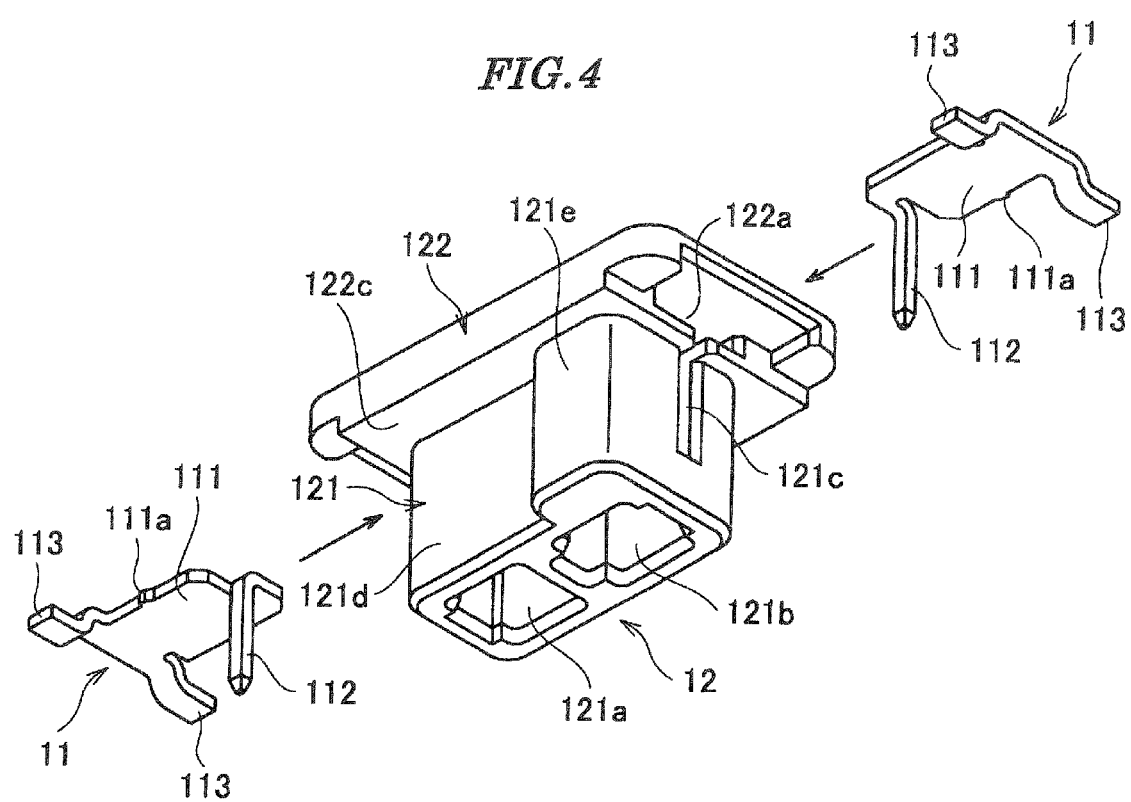
FIG. 4 is an exploded perspective view of the connector shown in FIG. 1.
Figure 5:
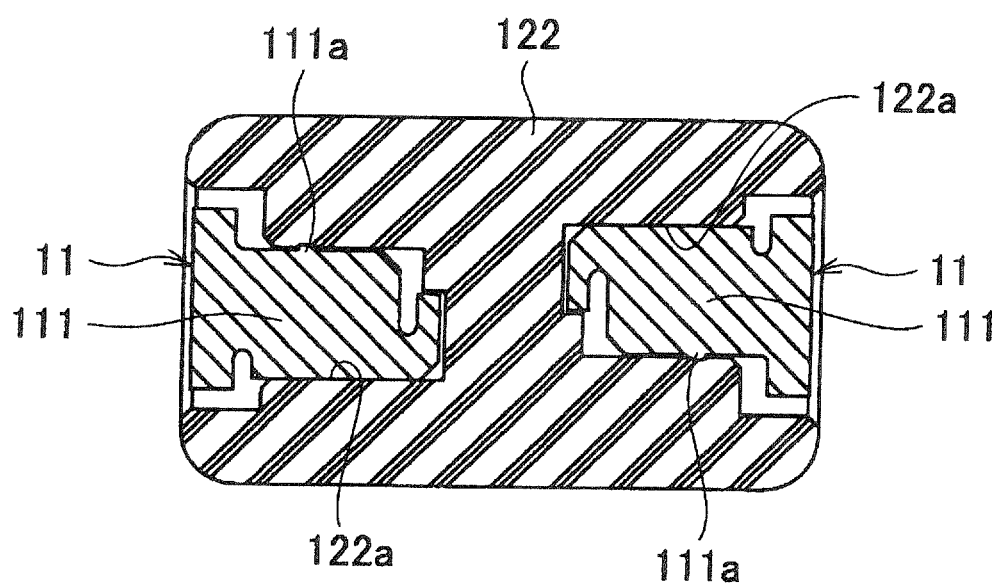
FIG. 5 is a cross-sectional view taken along V-V in FIG. 3.

The housing main body 121 is formed with slots 121c via which the contacts 11 are inserted into the connector receiving portions 121a and 121b and the contact accommodating portions 122a, from inserting directions (predetermined direction) D2 (see FIG. 2).

Figure 1:
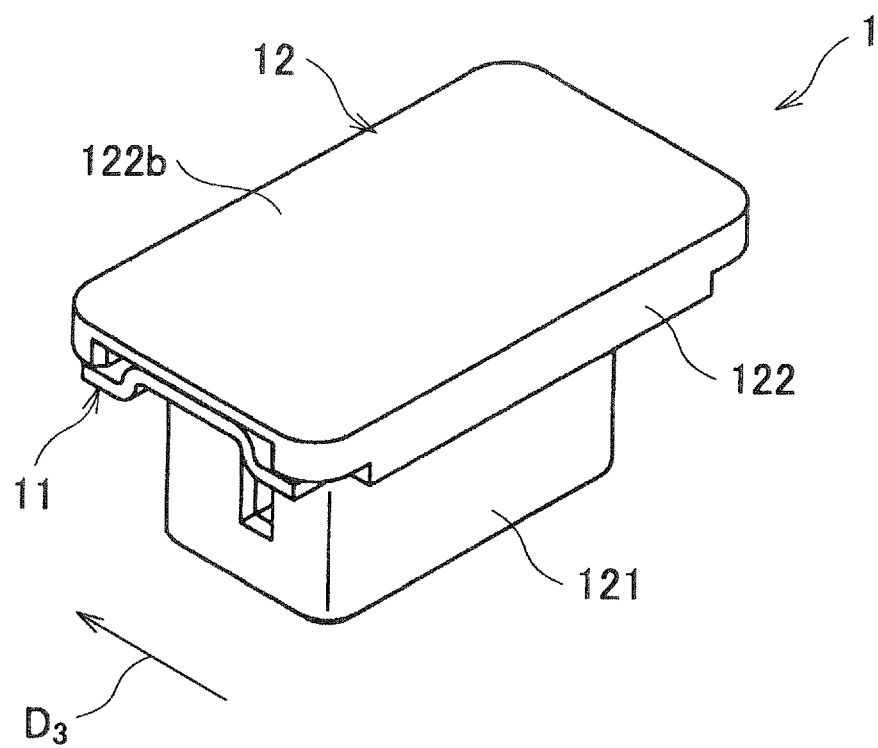
FIG. 1 is a perspective view of a connector according to a first embodiment of the present invention, taken obliquely from above.

The housing main body 121 has a key 121e protruding from a side surface 121d in a direction D3 of the connector 1 (see FIG. 1). The key 121e extends in the fitting direction D1. A transverse cross-sectional shape of the housing main body 121 of the connector 1 corresponds to a planar shape of the hole 4b of the LED mounting substrate 4. When the housing main body 121 is inserted in the hole 4b of the LED mounting substrate 4, if the housing main body 121 is not oriented in a correct direction, the housing main body 121 cannot be inserted in the hole 4b of the LED mounting substrate 4. The housing main body 121 is prevented from being erroneously inserted so as to ensure connection of same polarity portions.

When the housing main body 121 is inserted in the hole 4b of the LED mounting substrate 4, the upper surface 122b of the top board portion 122 becomes substantially parallel to the upper surface 4a of the LED mounting substrate 4, a front end portion (front side portion in the direction D1 of fitting the housing 12 into the hole 4b) of the housing main body 121 protrudes downward from a lower surface 4c (see FIG. 8) of the LED mounting substrate 4, and a lower surface 122c of the top board portion 122 is opposed to the upper surface 4a of the LED mounting substrate 4. When the top board portion 122 is viewed from approximately exactly above, the contacts 11 almost in their entirety are hidden by the top board portion 122. When the top board portion 122 is illuminated from approximately exactly above, the connection portions 113 are located within an area of a projected image of the top board portion 122 formed on a plane of projection (the upper surface 4a of the LED mounting substrate 4), and hence when the top board portion 122 is viewed from approximately exactly above, the connection portions 113 almost in their entirety are hidden by the top board portion 122.

Next, a description will be given of assembly of the LED bulb 10.

Before the assembly of the LED bulb 10, the LEDs 8, the connector 1, and so forth, which are arranged at predetermined locations on the upper surface 4a of the LED mounting substrate 4, are soldered using e.g. a reflow furnace in advance. With this process, the connection portions 113 of the contacts 11 are soldered to the lands 4aa of the LED mounting substrate 4, respectively.

To assemble the LED bulb 10, first, the power board 3 is accommodated in and fixed to the housing 2.

Next, the cable connector 5 is fitted to the connector 1 mounted on the LED mounting substrate 4.

Then, the LED mounting substrate 4 having the LEDs 8 and the connector 1 mounted thereon is disposed on a supporting portion 2b at a location toward a front end of the housing 2. At this time, the cutouts 4d of the LED mounting substrate 4 are aligned with respective screw holes 2c of the supporting portion 2b.

Next, the screws 7 are screwed into the screw holes 2c through the cutouts 4d, respectively.

Finally, the bulb cover 6 is mounted on the supporting portion 2b of the front end of the housing 2.

When the above-described assembly steps are done, the assembly of the LED bulb 10 is completed.

According to the first embodiment, the direction D2 of inserting each contact 11 into the associated contact accommodating portion 122a of the housing 12 is substantially orthogonal to the longitudinal direction of the contact portion 112 of each contact 11. Therefore, the dimension of the housing 12 in the fitting direction is reduced, and the dimension of the connector 1 in the fitting direction is reduced. As a result, when the connector 1 is used as one for the LED bulb 10 as described above, the housing 12 does not largely protrude from the upper surface 4a of the LED mounting substrate 4, so that the amount of light from the LEDs 8 blocked by the connector 1 mounted on the LED mounting substrate 4 is reduced, and hence when a user views the LED bulb 10 in the on state, a portion where the connector 1 is located does not appear darker than the other portions.

Further, in the conventional connector, the connection portion of each contact connected with the circuit board protrudes from the housing, and is exposed when viewed from above the circuit board, and hence there is a problem that when the lighting device in the on state is viewed, a portion where the connection portion of each contact is exposed appears darker than the other portions. However, in the connector according to the present embodiment, when the top board portion 122 is viewed from approximately exactly above, the connection portions 113 are located within the area of the projected image of the top board portion 122 formed on the projected surface (the upper surface 4*a* of the LED mounting substrate 4), and hence connection portions 113 almost in their entirety are hidden under the top board portion 122, so that portions where the connection portions 113 of the contact 11 are located do not appear darker than the other portions. Even when part of the connection portions 113 is exposed, if the exposed part is small, the portions where the connection portions 113 are located do not appear darker.

Further, since the housing 12 is integrally formed of a white or white based colored resin, it is possible to prevent the top board portion 122 of the housing 12 from appearing darker than the other portions.

Further, since each contact 11 has the two connection portions 113, a special member for stabilizing each contact 11 is not required.

Further, it is only required to make the width of each slot 121*c* formed in the housing main body 121 slightly larger than the plate thickness of each contact 11, and hence it is possible to prevent the strength of the housing 12 from being reduced.

Next, a description will be given of a connector according to a second embodiment of the present invention with reference to FIGS. 10 to 17. Components common to the second embodiment and the first embodiment are denoted by the same reference numerals, and detailed description thereof is omitted.

As shown in FIGS. 10 to 16, a connector 201 comprises contacts 2011, and a housing 2012 which holds the contacts 2011.

The housing 2012 includes a box-shaped housing main body 2121 which is inserted in a hole (inserted portion) 204*b* of the LED mounting substrate 4, and a planar plate-shaped top board portion 2122 which is continuous with the housing main body 2121.

The contacts 2011 each include a planar plate-shaped holding portion 2111 held by the top board portion 2122, a pin-shaped contact portion 2112 which is continuous with the holding portion 2111 and extends in a direction substantially orthogonal to the holding portion 2111, and two L-shaped connection portions 2113 which are continuous with the holding portion 2111 and are each soldered to an associated one of the lands 4*aa* of the LED mounting substrate 4. The holding portion 2111 has a protrusion 2111*a*. When the holding portion 2111 is inserted in an associated one of contact accommodating portions 2122*a*, the protrusion 2111*a* bites into an inner wall surface of the associated contact accommodating portion 2122*a*.

The housing main body 2121 is formed with a connector receiving portion 2121*a* that accommodates the contact portions 2112, and receives a cable connector (mating connector) 205.

The top board portion 2122 is formed with the contact accommodating portions 2122*a* which communicate with the connector receiving portion 2121*a*, and each accommodate at least the holding portion 2111 of each contact 2011.

Figure 13:
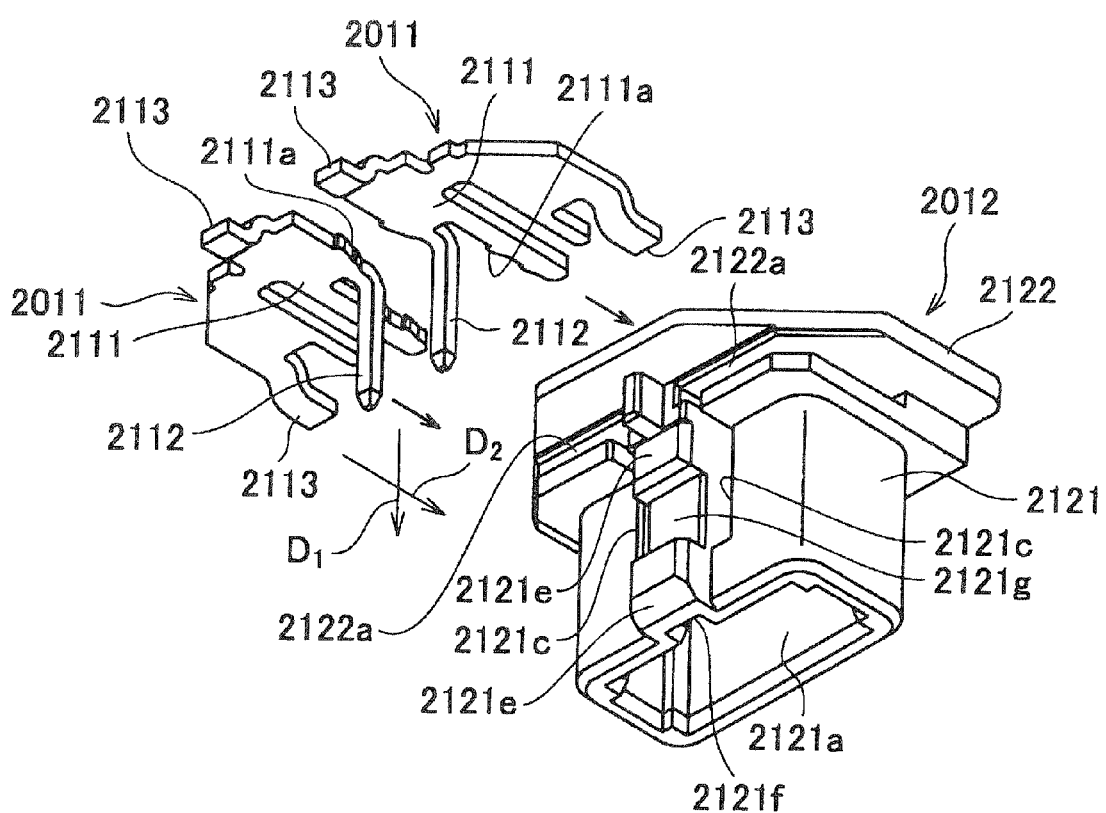
FIG. 13 is an exploded perspective view of the connector shown in FIG. 10.
Figure 14:
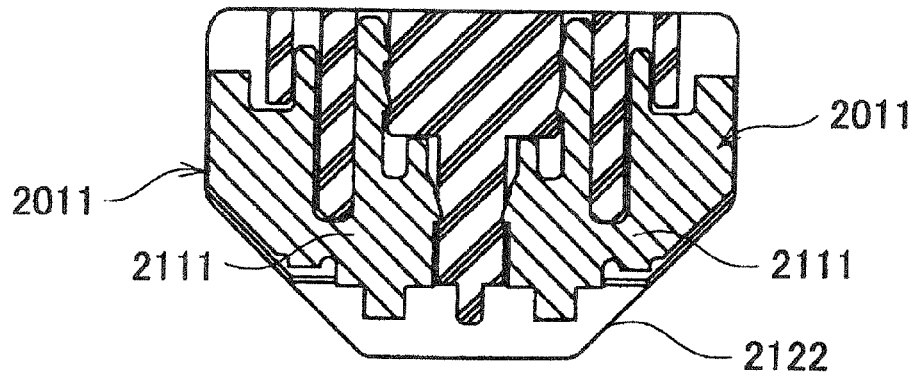
FIG. 14 is a cross-section view taken along XIV-XIV in FIG. 12.
Figure 15:
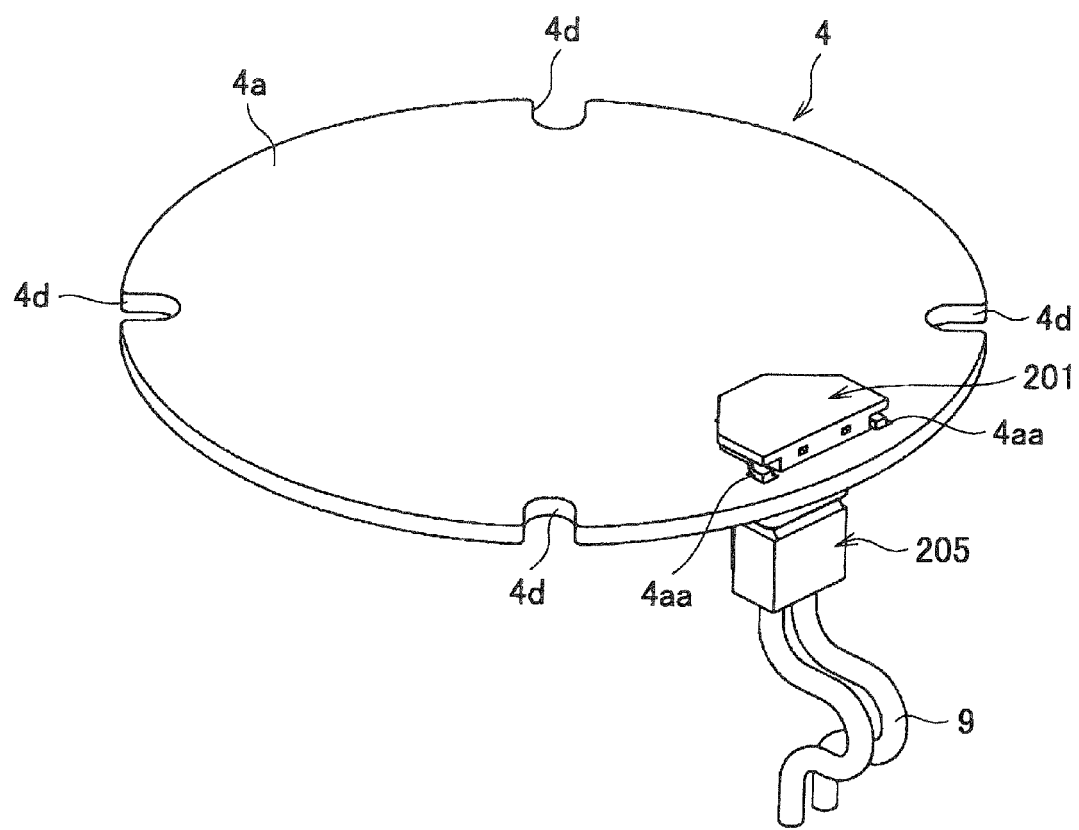
FIG. 15 is a perspective view of the LED mounting substrate, taken obliquely from above.
Figure 16:
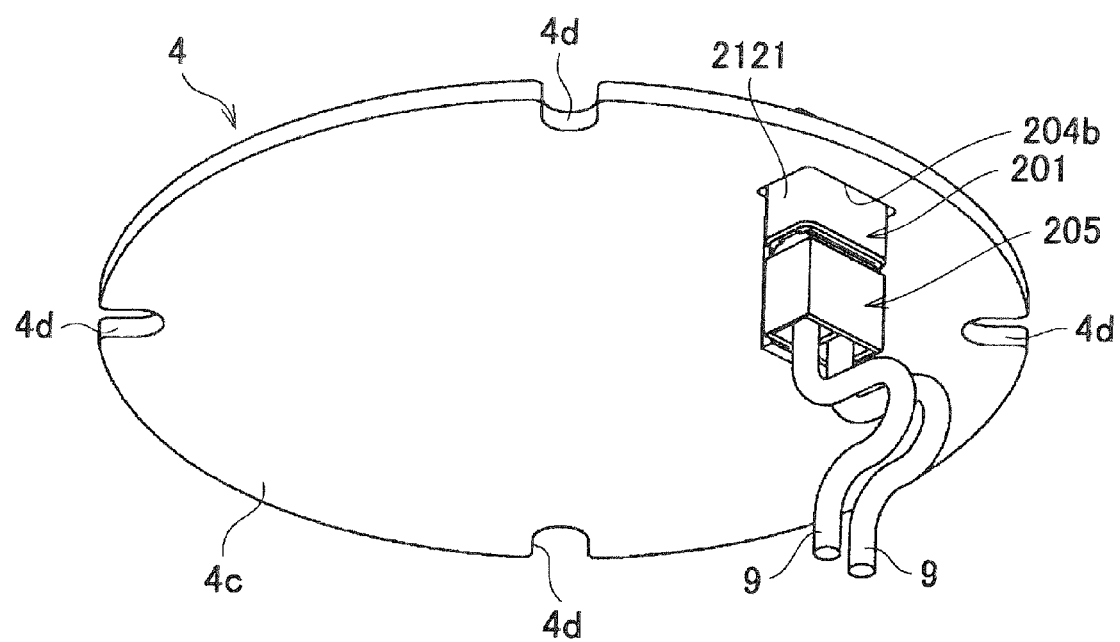
FIG. 16 is a perspective view of the LED mounting substrate, taken obliquely from below.

The housing main body 2121 has a front portion formed with slots 2121*c* via which the contacts 2011 are inserted into the connector receiving portion 2121*a* and the contact accommodating portions 2122*a*, from an inserting direction (predetermined direction) D2 orthogonal to the connector fitting direction D1 (see FIG. 13).

Figure 17:
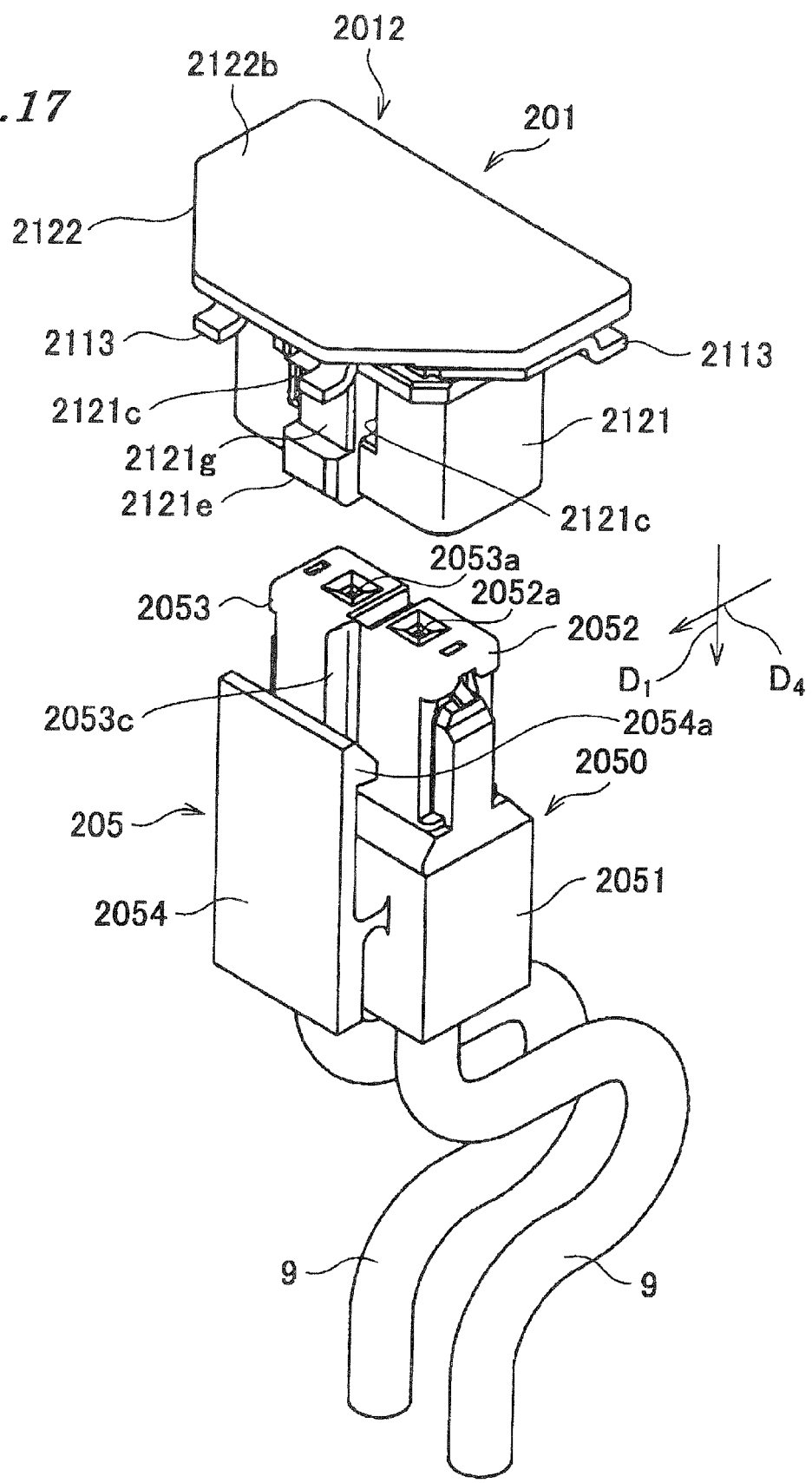
FIG. 17 is a perspective view of the connector shown in FIG. 10 and a cable connector which is fitted to this connector.

Further, as shown in FIG. 17, the housing main body 2121 has a key 2121*e* protruding in a direction D4 of the connector 201. The key 2121*e* extends in the connector fitting direction D1. A transverse cross-sectional shape of the housing main body 2121 of the connector 201 corresponds to the hole 204*b* of the LED mounting substrate 4. The key 2121*e* has a recess-shaped engaging portion 2121*g* formed in a central portion thereof, with which a locking lug 2054*a* of a locking portion 2054 of the cable connector (mating connector) 205 is engaged. The housing main body 2121 has a key groove 2121*f* (see FIG. 13) formed in an inner peripheral surface thereof, in which a key 2053*c* formed on a fitting portion 2053 of the cable connector 205 is fitted.

When the housing main body 2121 is inserted in the hole 204*b* of the LED mounting substrate 4, an upper surface 2122*b* of the top board portion 2122 becomes substantially parallel to the upper surface 4*a* of the LED mounting substrate 4, a front end portion of the housing main body 2121 protrudes downward from the lower surface 4*c* (see FIG. 16) of the LED mounting substrate 4, and a lower surface 2122*c* of the top board portion 2122 is opposed to the upper surface 4*a* of the LED mounting substrate 4. When the top board portion 2122 is viewed from approximately exactly above, the contacts 2011 almost in their entirety are hidden by the top board portion 2122. When the top board portion 2122 is illuminated from approximately exactly above, the connection portions 2113 are located within an area of a projected image of the top board portion 2122 formed on a plane of projection (the upper surface 4*a* of the LED mounting substrate 4), and hence the connection portions 2113 are substantially hidden under the top board portion 2122.

According to the second embodiment, it is possible to obtain advantageous effects as provided by the first embodiment.

Next, a description will be given of a connector according to a third embodiment of the present invention with reference to FIGS. 18 to 26. Components common to the third embodiment and the first and second embodiments are denoted by the same reference numerals, and detailed description thereof is omitted.

As shown in FIGS. 18 to 24, a connector 301 comprises contacts 3011, and a housing 3012 which holds the contacts 3011. Note that an LED mounting substrate (substrate) on which the connector 301 is mounted is a substrate (not shown) having a hole (inserted portion) in a central portion thereof similarly to an LED mounting substrate 404 shown in FIG. 33.

The housing 3012 includes a box-shaped housing main body 3121 which is inserted in a hole (inserted portion) of an LED mounting substrate, not shown, for having the connector inserted therein, and a planar plate-shaped top board portion 3122 which is continuous with the housing main body 3121.

Figure 23:
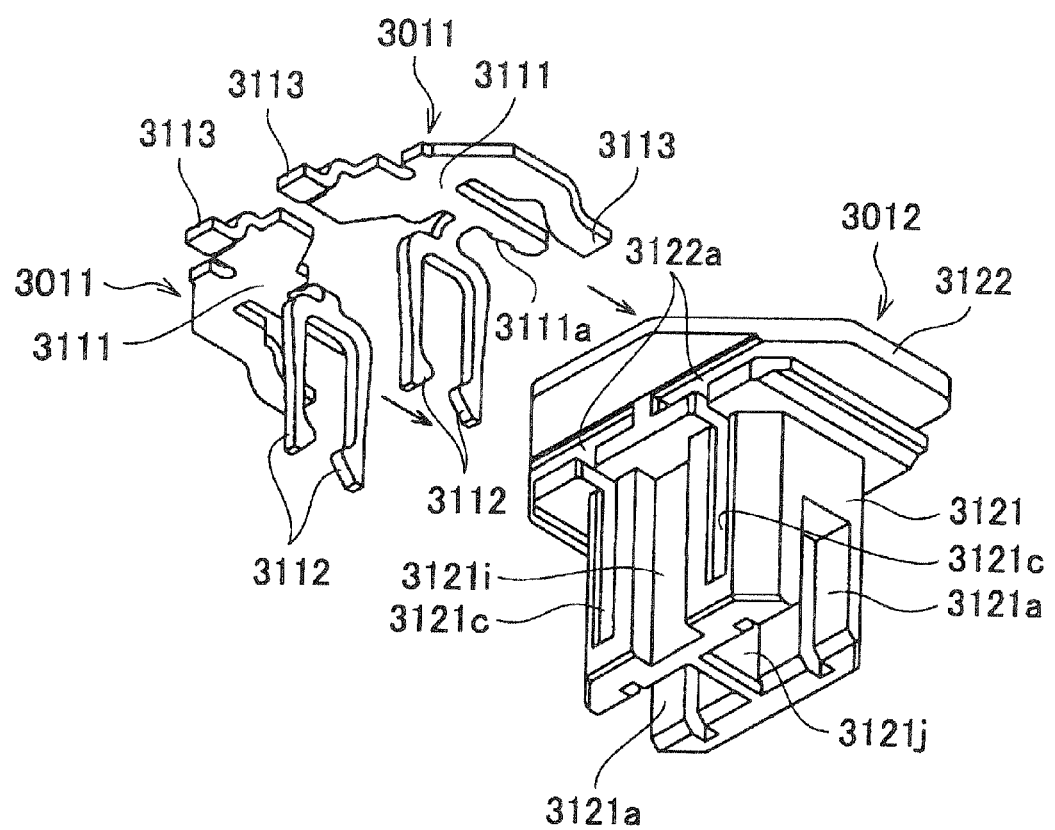
FIG. 23 is an exploded perspective view of the connector shown in FIG. 18.
Figure 24:
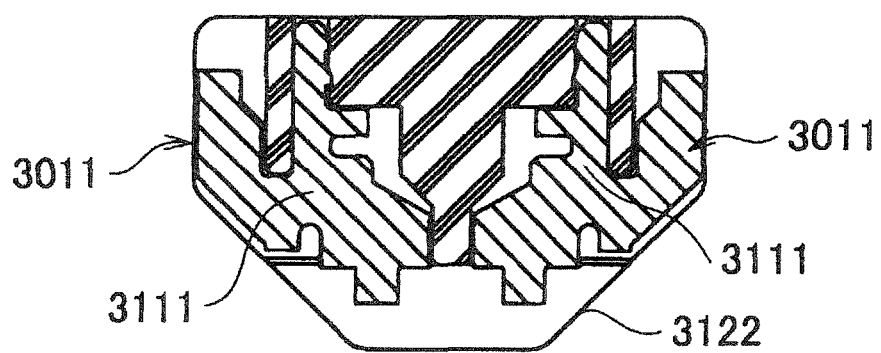
FIG. 24 is a cross-section view taken along XXIV-XXIV in FIG. 20.
Figure 25:
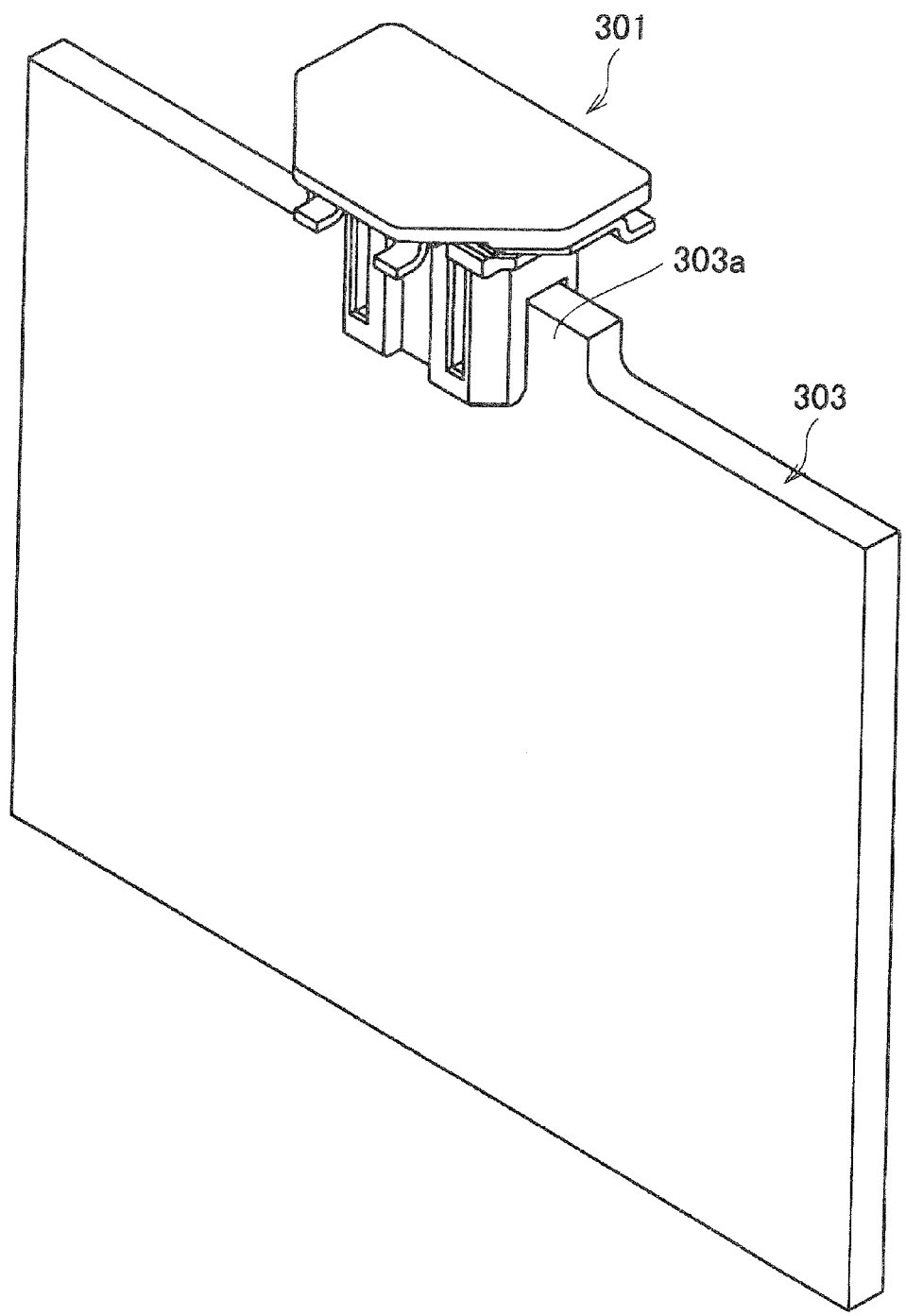
FIG. 25 is a perspective view of the connector shown in FIG. 18 and a printed board in a state fitted to each other.
Figure 26:
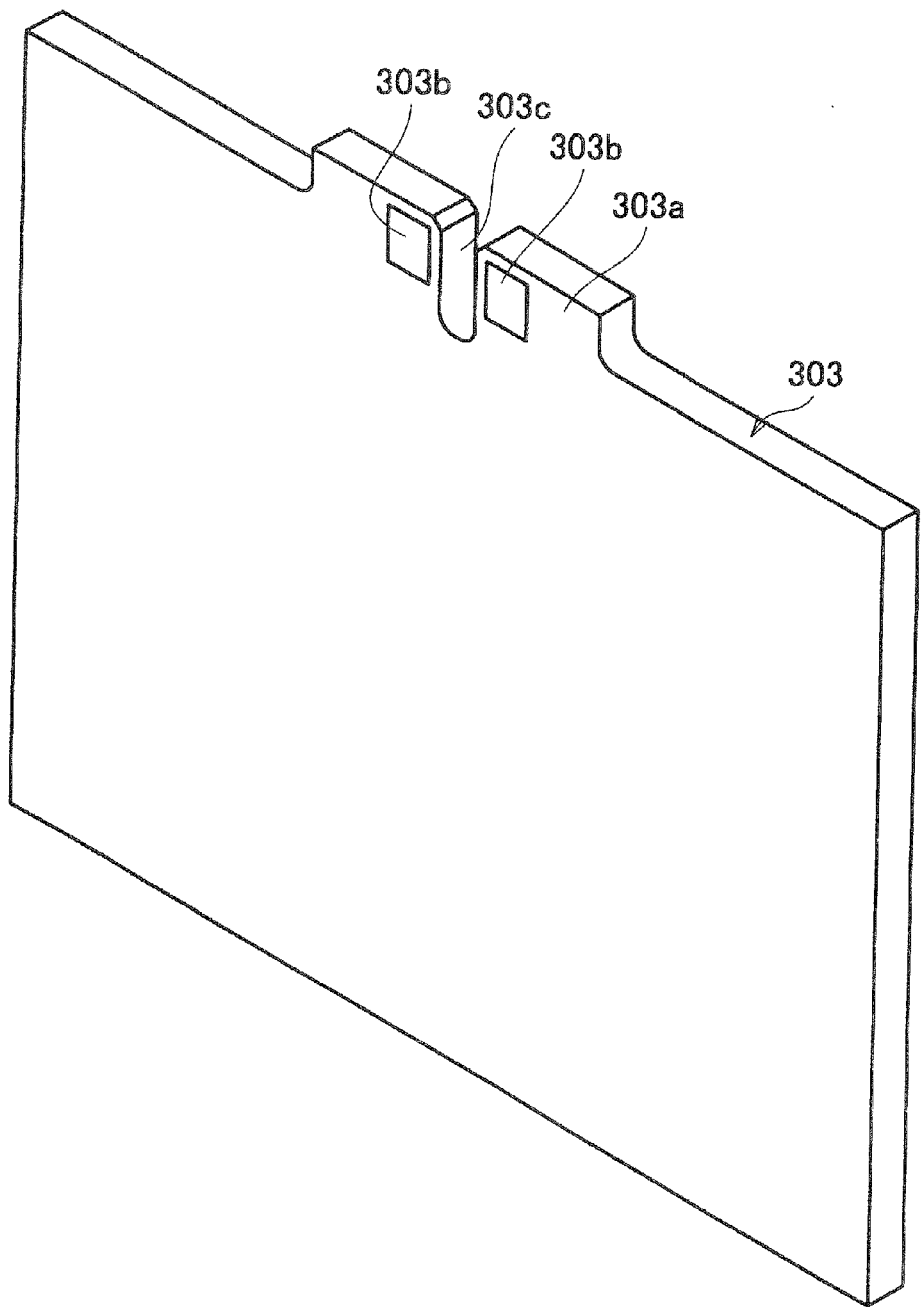
FIG. 26 is a perspective view of the connector shown in FIG. 18 and the printed board in a state before being fitted to each other.
Figure 27:
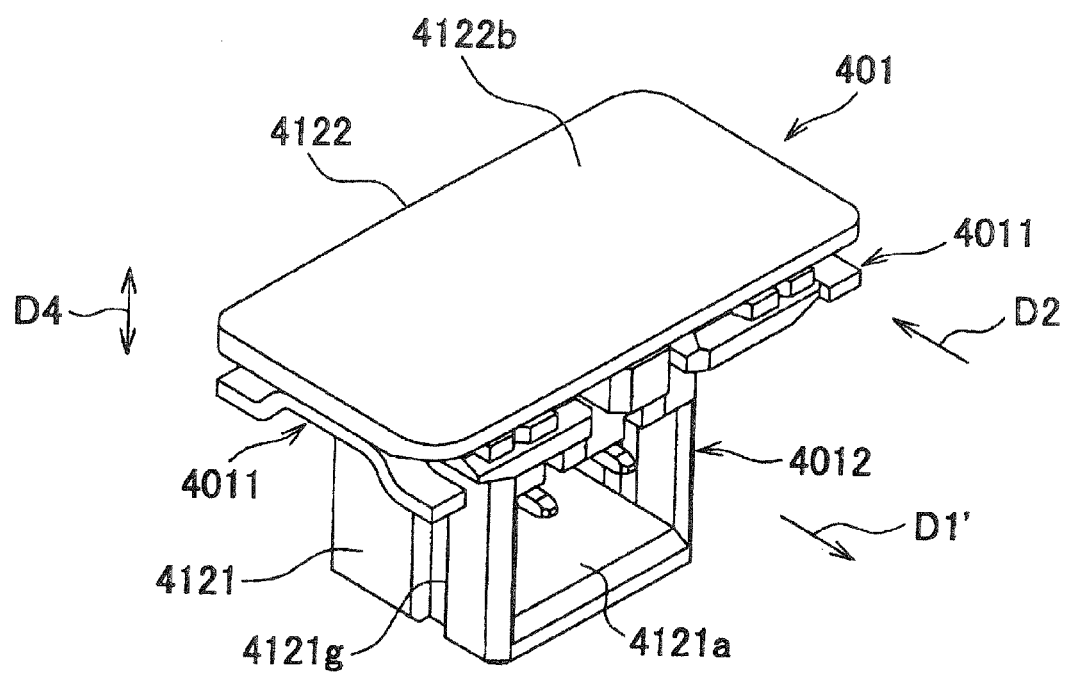
FIG. 27 is a perspective view of a connector according to a fourth embodiment of the present invention, taken obliquely from above.
Figure 28:
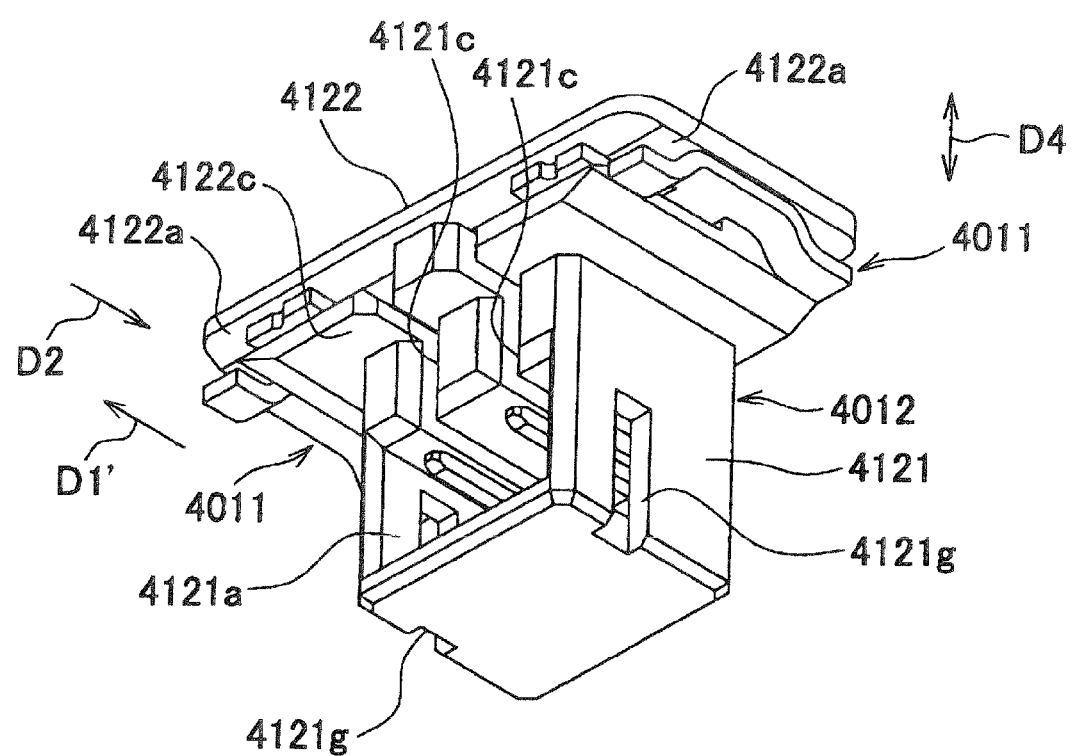
FIG. 28 is a perspective view of the connector shown in FIG. 27, taken obliquely from below.
Figure 29:
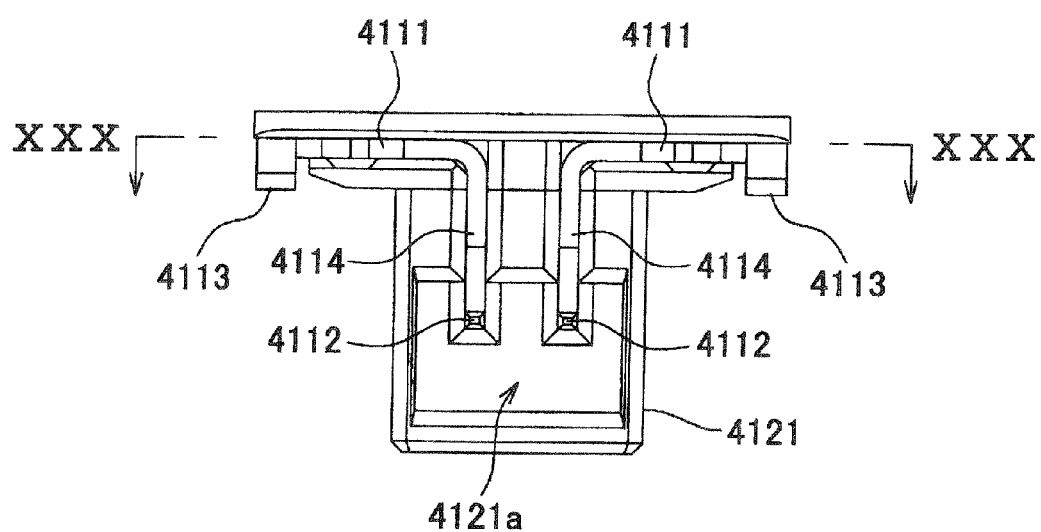
FIG. 29 is a front view of the connector shown in FIG. 27.
Figure 30:
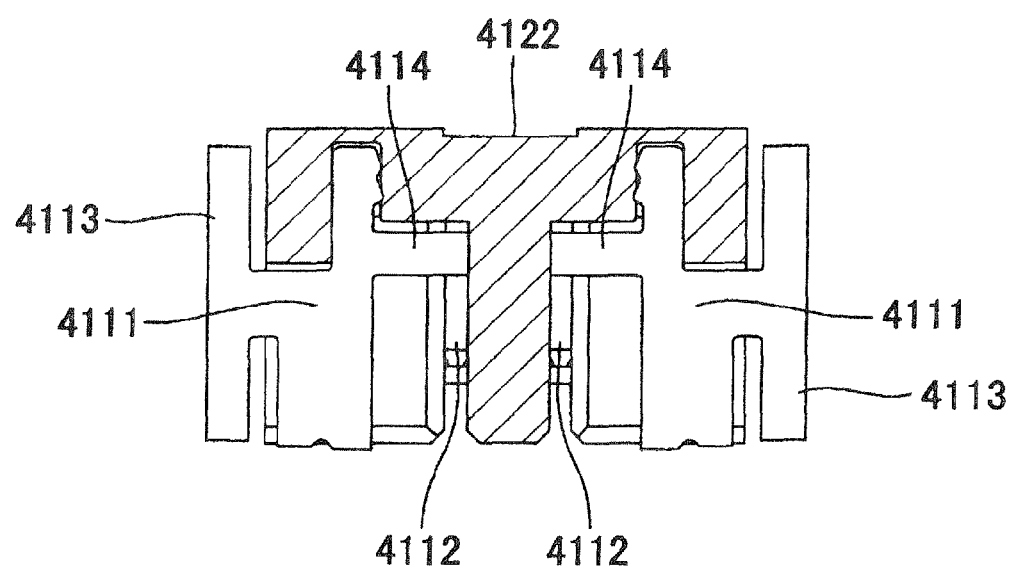
FIG. 30 is a cross-section view taken along XXX-XXX in FIG. 29.

The contacts 3011, as shown in FIG. 23, each include a planar plate-shaped holding portion 3111 held by the top board portion 3122, a bifurcated contact portion 3112 which is continuous with the holding portion 3111 and extends in a direction substantially orthogonal to the holding portion 3111, and two L-shaped connection portions 3113 which are continuous with the holding portion 3111 and are each soldered to an associated one of lands (not shown) of the LED mounting substrate. The holding portion 3111 has a protrusion 3111*a*. When the holding portion 3111 is inserted in an associated one of contact accommodating portions 3122*a*, described hereinafter, of the top board portion 3122, the protrusion 3111*a* bites into an inner wall surface of the associated contact accommodating portion 3122*a*.

The housing main body 3121 is formed with a connector receiving portions 3121a which accommodate the contact portions 3112 of the contacts 3011, respectively, and receive edge connector portions (mating connectors) 303a (see FIGS. 25 and 26) of a power board 303. The edge connector portions 303a are each formed with an electrode 303b which is brought into contact with the contact portion 3112 of each contact 3011. The power board 303 is disposed perpendicularly to the LED mounting substrate (not shown).

The top board portion 3122 is formed with the contact accommodating portions 3122a (see FIG. 23) which communicate with the connector receiving portions 3121a, respectively, and each accommodate at least the holding portion 3111 of each contact 3011.

Figure 18:
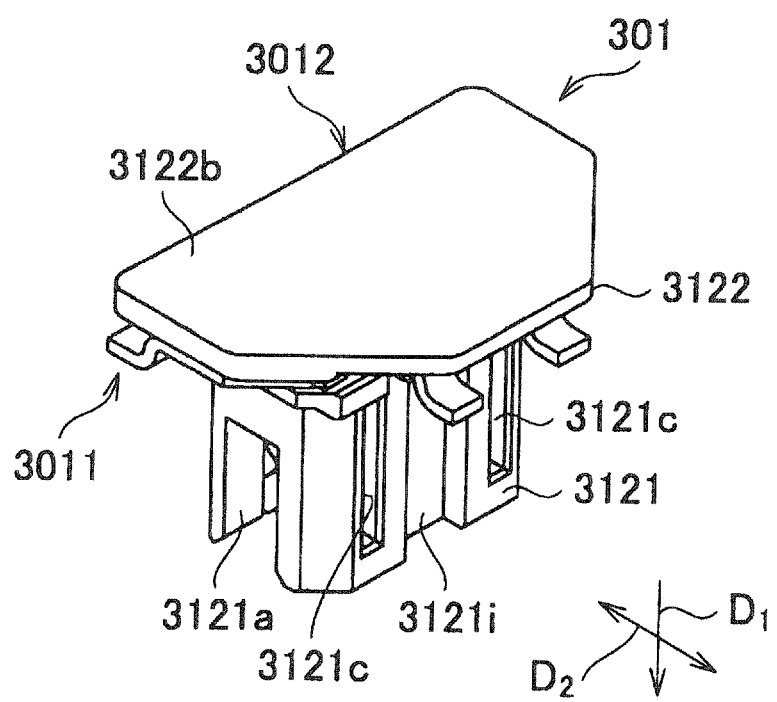
FIG. 18 is a perspective view of a connector according to a third embodiment of the present invention, taken obliquely from above.
Figure 19:
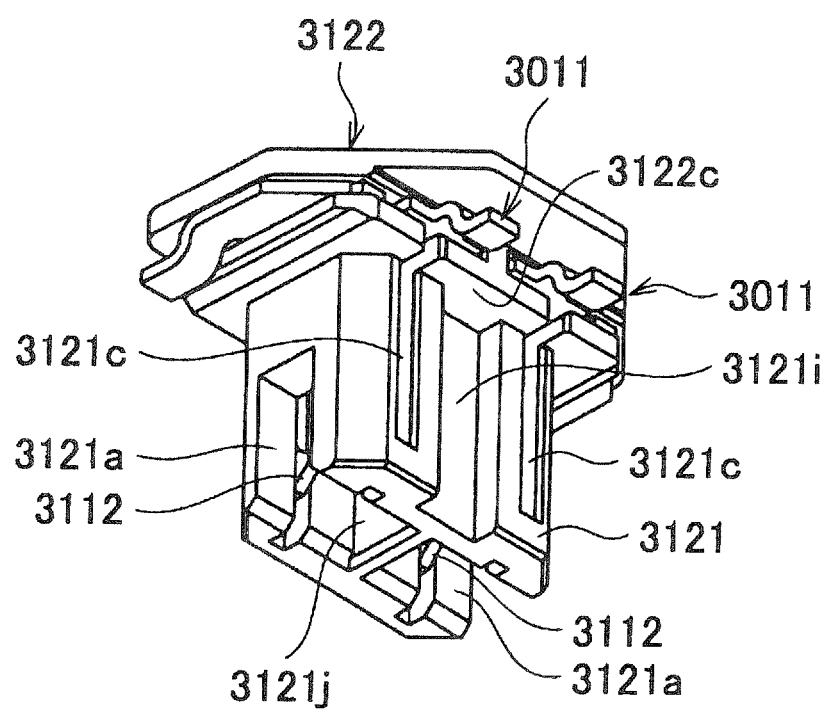
FIG. 19 is a perspective view of the connector shown in FIG. 18, taken obliquely from below.
Figure 20:
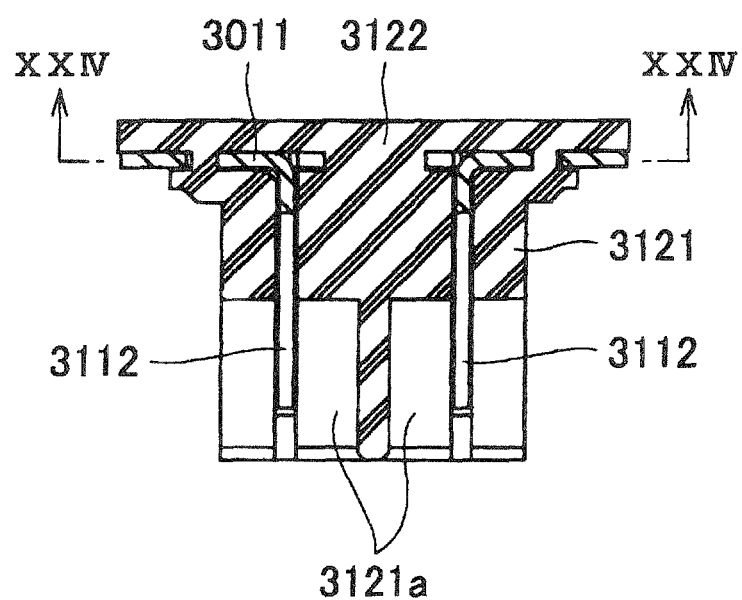
FIG. 20 is a longitudinal cross-sectional view of the connector shown in FIG. 18.
Figure 21:
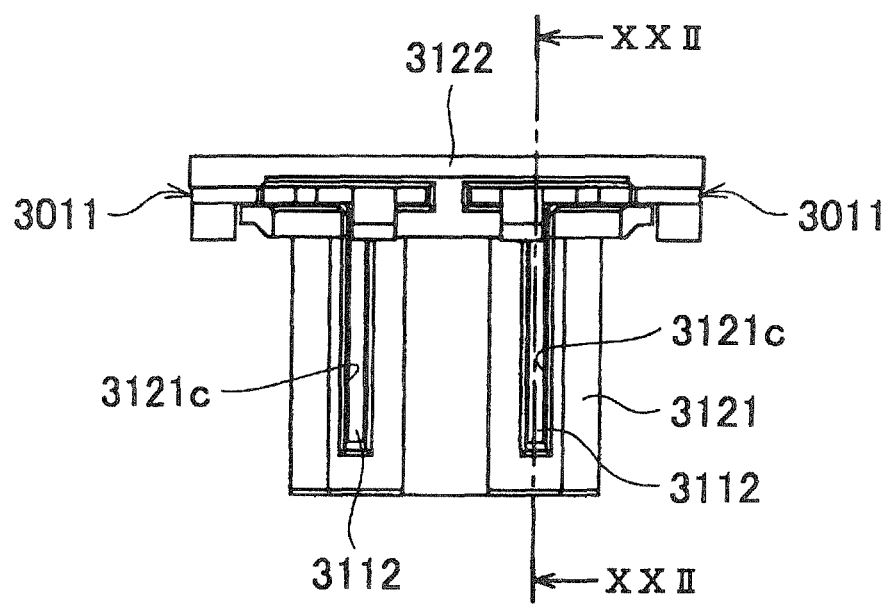
FIG. 21 is a front view of the connector shown in FIG. 18.
Figure 22:
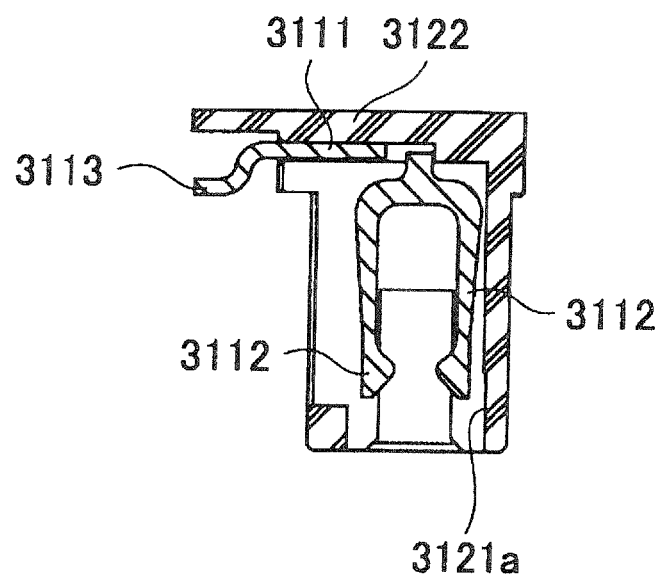
FIG. 22 is a cross-section view taken along XXII-XXII in FIG. 21.

The housing main body 3121 has a front portion formed with slots 3121c which communicate with the connector receiving portions 3121a, respectively, and via which the contacts 3011 are inserted into the connector receiving portions 3121a from the inserting direction D2 (see FIG. 18) orthogonal to the connector fitting direction D1 (see FIG. 18).

The housing main body 3121 has a key groove 3121i. The key groove 3121i extends in the connector fitting direction D1. A key (not shown) formed on the LED mounting substrate in a manner protruding into a connector insertion hole (not shown) of the LED mounting substrate is inserted in the key groove 3121i. A transverse cross-sectional shape of the housing main body 3121 of the connector 301 corresponds to the connector insertion hole of the LED mounting substrate.

A partition 3121j is formed within the housing main body 3121. The power board 303 is formed with a slot 303c (see FIG. 26) for avoiding interference with the partition 3121j.

When the housing main body 3121 is inserted in the connector insertion hole of the LED mounting substrate (not shown), an upper surface 3122b of the top board portion 3122 becomes substantially parallel to an upper surface of the LED mounting substrate, a front end portion of the housing main body 3121 protrudes downward from a lower surface of the LED mounting substrate, and a lower surface 3122c of the top board portion 3122 is opposed to the upper surface of the LED mounting substrate. When the top board portion 3122 is viewed from approximately exactly above, the contacts 3011 almost in their entirety are hidden by the top board portion 3122. When the top board portion 2122 is illuminated from approximately exactly above, the connection portions 3113 are located within an area of a projected image of the top board portion 3122 formed on a plane of projection (the upper surface of the LED mounting substrate), and hence the connection portions 3113 are substantially hidden by the top board portion 3122.

According to the third embodiment, it is possible to obtain advantageous effects as provided by the first embodiment, and it is possible to electrically connect the LED mounting substrate and the power board 303 without using a cable connector and a cable.

Next, a description will be given of a connector according to a fourth embodiment of the present invention with reference to FIGS. 27 to 35. Components common to the fourth embodiment and the first embodiment are denoted by the same reference numerals, and detailed description thereof is omitted.

As shown in FIGS. 27 to 31, a connector 401 comprises contacts 4011, and a housing 4012 which holds the contacts 4011. Although in the first to third embodiments, the direction D2 of inserting the contacts 11, 2011, or 3011 into the housing 12, 2012, or 3012 is orthogonal to the connector fitting direction D1 of the connector 1, 201, or 301, in the fourth embodiment, the direction D2 (see FIG. 27) of inserting the contacts 4011 into the housing 4012 and a connector fitting direction D1' (see FIG. 27) of the connector 401 are parallel to each other.

The housing 4012 includes a box-shaped housing main body 4121 which is inserted in a hole (inserted portion) 404b of the LED mounting substrate (substrate) 404, and a planar plate-shaped top board portion 4122 which is continuous with the housing main body 4121.

Figure 31:
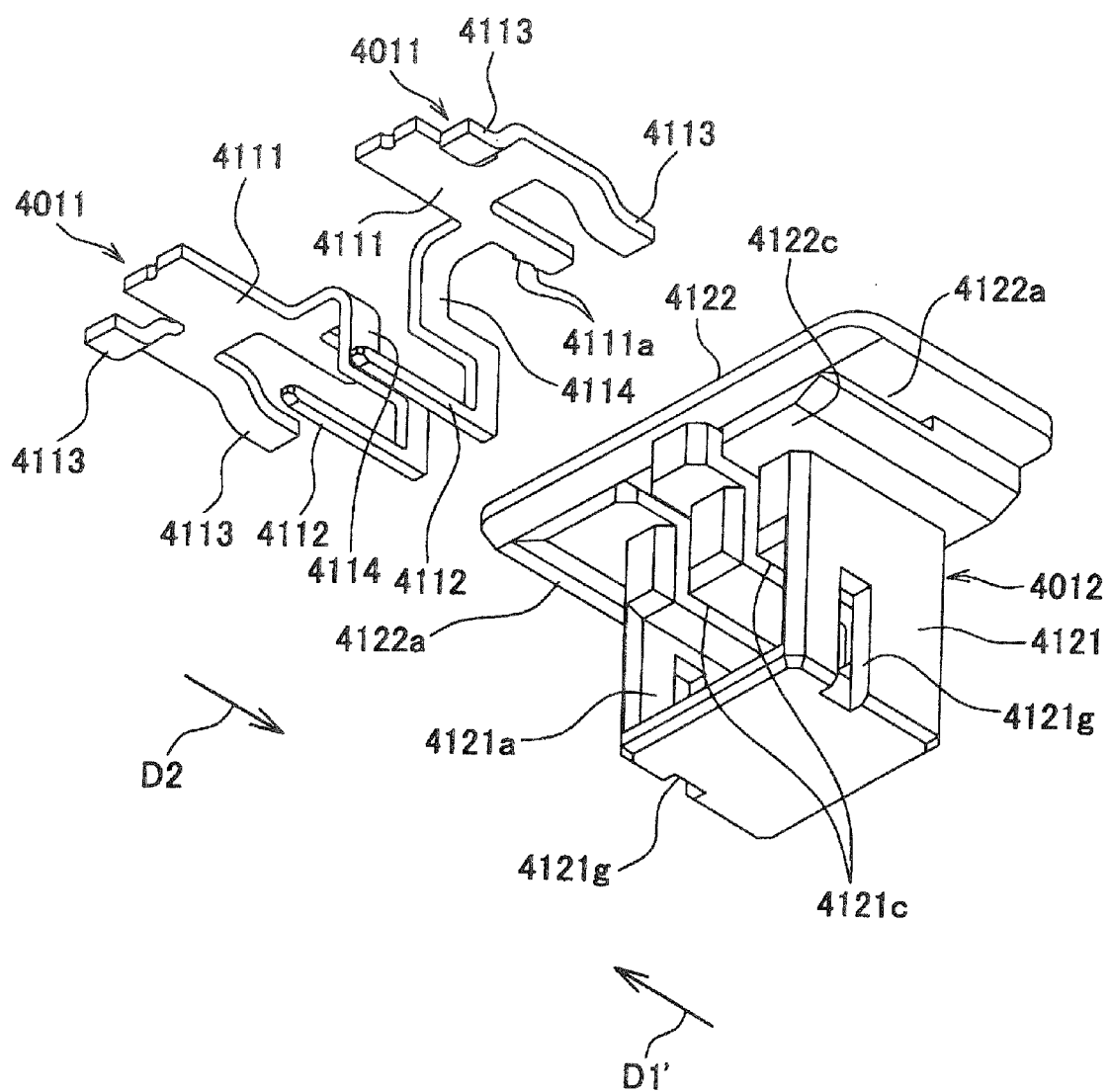
FIG. 31 is an exploded perspective view of the connector shown in FIG. 27.

The contacts 4011, as shown in FIG. 31, each include a plate-shaped holding portion 4111 held by the top board portion 4122, a pin-shaped contact portion 4112 which is continuous with the holding portion 4111 via a linking portion 4114 and extends in a direction substantially parallel to the holding portion 4111, and two L-shaped connection portions 4113 which are continuous with the holding portion 4111 and are each soldered to an associated one of lands 404aa (see FIG. 32) of the LED mounting substrate 404. The linking portion 4114 links between the holding portion 4111 and the contact portion 4112. The holding portion 4111 has protrusions 4111a. When the holding portion 4111 is inserted in an associated one of contact accommodating portions 4122a, described hereinafter, the protrusions 4111a bite into an inner wall surface of the associated contact accommodating portion 4122a.

Figure 32:
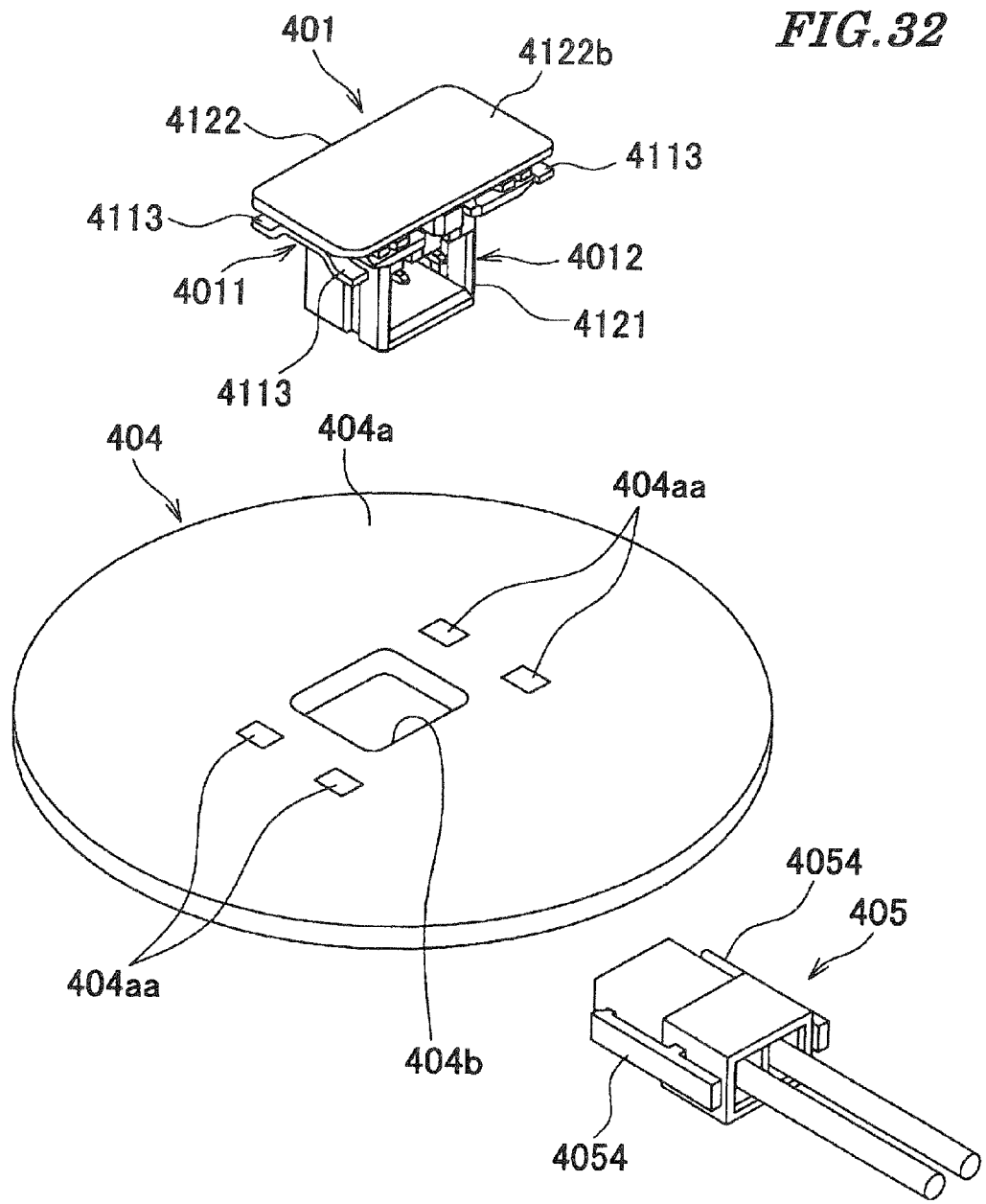
FIG. 32 is a perspective view of the connector shown in FIG. 27 in a state before being mounted on an LED mounting substrate.

The housing main body 4121 is formed with a connector receiving portion 4121a which accommodates the contact portions 4112 and receives a cable connector (mating connector) 405 (see FIG. 32). As mentioned above, the connector fitting direction D1' is parallel to the inserting direction D2, and the connector receiving portion 4121a opens in a front of the housing main body 4121.

The top board portion 4122 is formed with the contact accommodating portions 4122a which communicate with the connector receiving portion 4121a, and each accommodate at least the holding portion 4111 of each contact 4011 (see FIG. 31).

The housing main body 4121 is formed with slots 4121c via which the contacts 4011 are inserted into the housing 4012 from the inserting direction D2 parallel to the connector fitting direction D1' (see FIG. 31).

A transverse cross-sectional shape of the housing main body 4121 of the connector 401 corresponds to the hole 404b of the LED mounting substrate 404 (see FIG. 32). The housing main body 4121 has slot-shaped engaging portions 4121g (see FIGS. 27 and 28) formed in opposite side surfaces thereof, respectively, with which locking lugs 4054a of locking portions 4054 of the cable connector 405 (see FIGS. 32 and 33) are engaged, respectively.

As shown in FIG. 32, to mount the connector 401 on the LED mounting substrate 404, it is only required to insert the housing main body 4121 of the housing 4012 of the connector 401 into the hole 404b of the LED mounting substrate 404, and then solder the connection portion 4113 of each contact 4011 to the associated land 404aa of the LED mounting substrate 404 (e.g. by reflow soldering).

Figure 33:
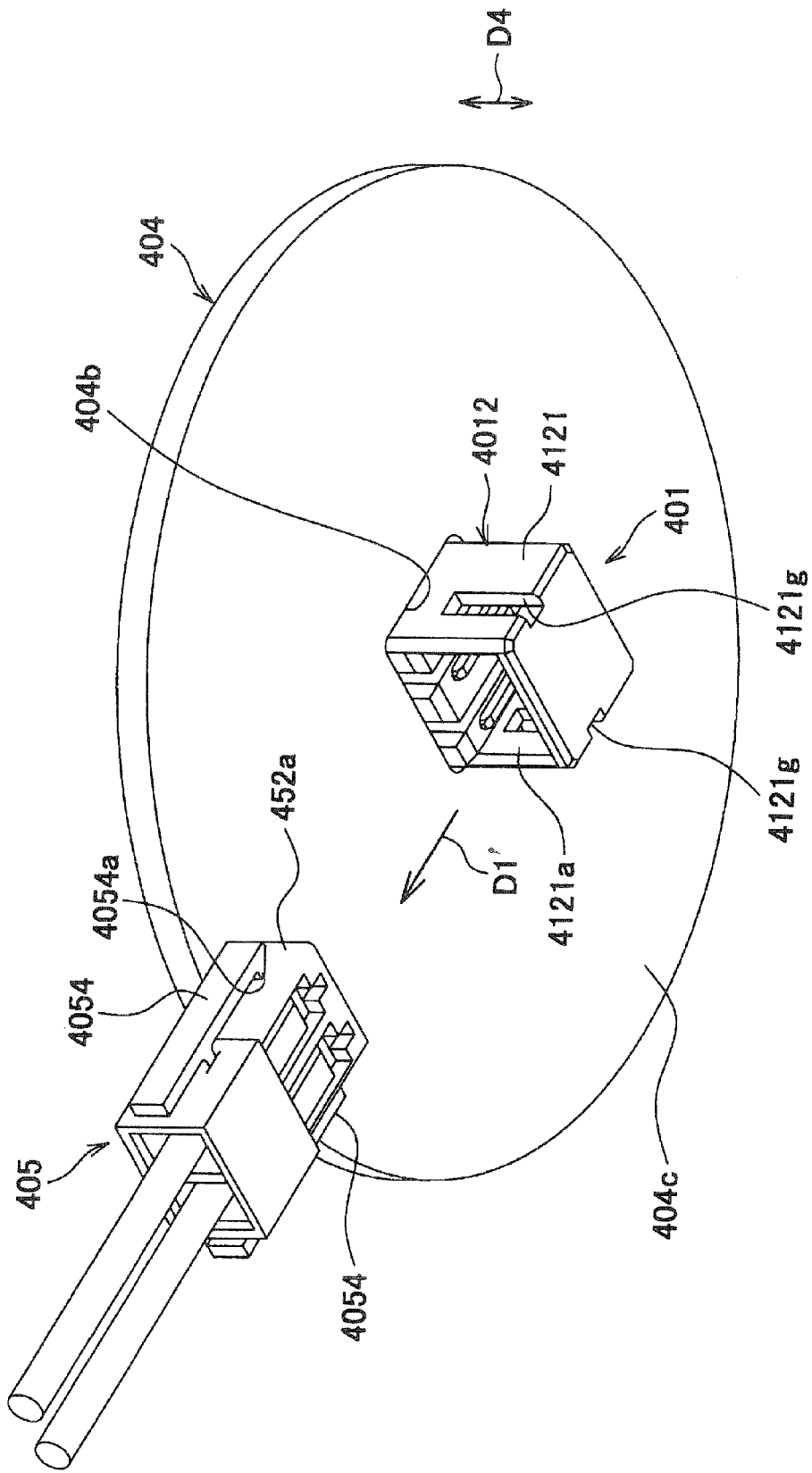
FIG. 33 is a perspective view of the connector shown in FIG. 27 mounted on the LED mounting substrate in a state before a cable connector is connected thereto, taken obliquely from below.
Figure 34:
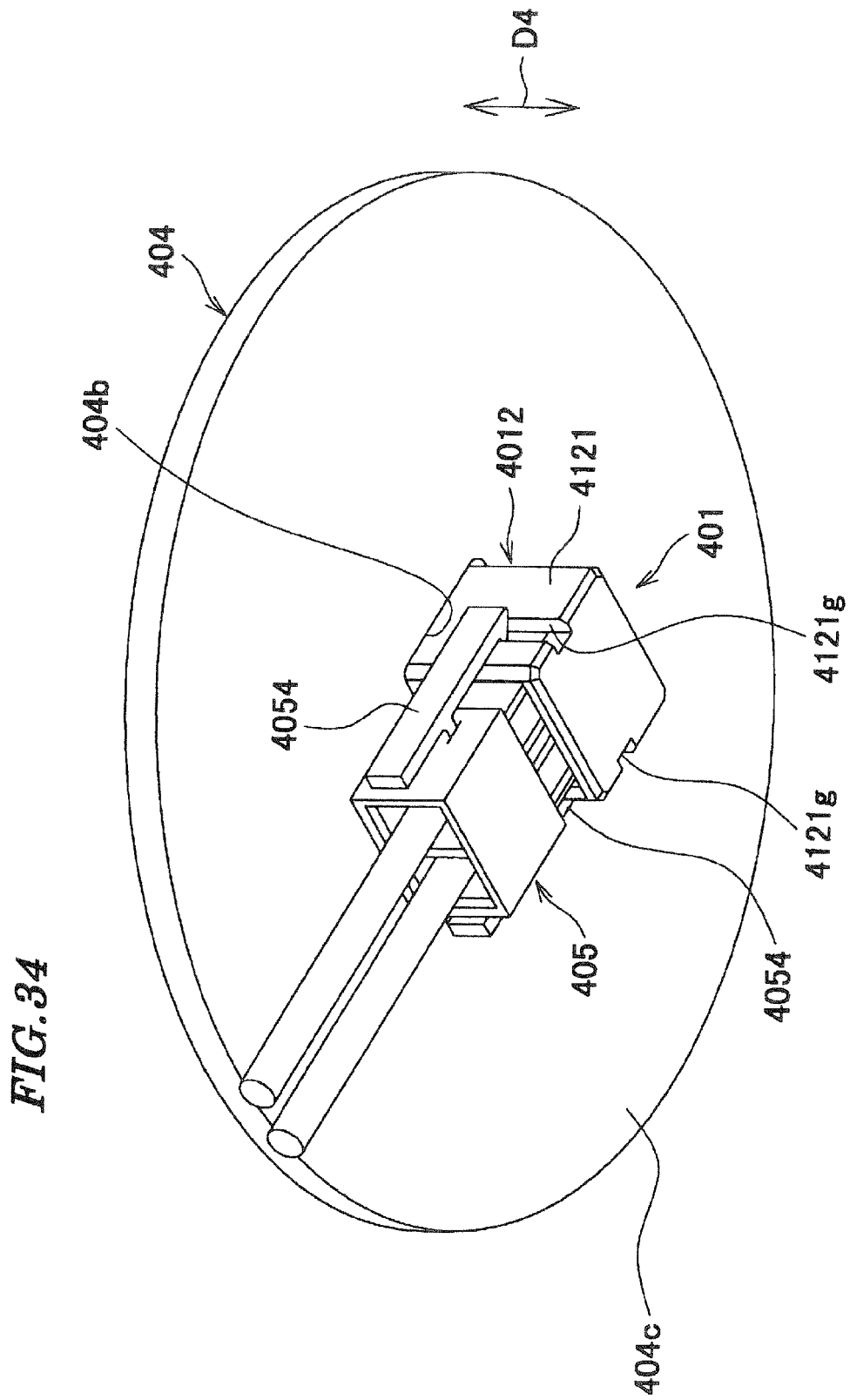
FIG. 34 is a perspective view of the connector shown in FIG. 27 mounted on the LED mounting substrate in a state in which the cable connector is connected thereto, taken obliquely from below.

As shown in FIGS. 33 and 34, to fit the cable connector 405 to the connector 401, it is only required to insert a fitting portion 452a of the cable connector 405 into the connector receiving portion 4121a of the connector 401. The locking lugs 4054a of the locking portions 4054 of the cable connector 405 fitted to the connector 401 are hooked to the engaging portions 4121g of the connector 401, respectively, whereby the cable connector 405 is fixed to the connector 401.

Figure 35:
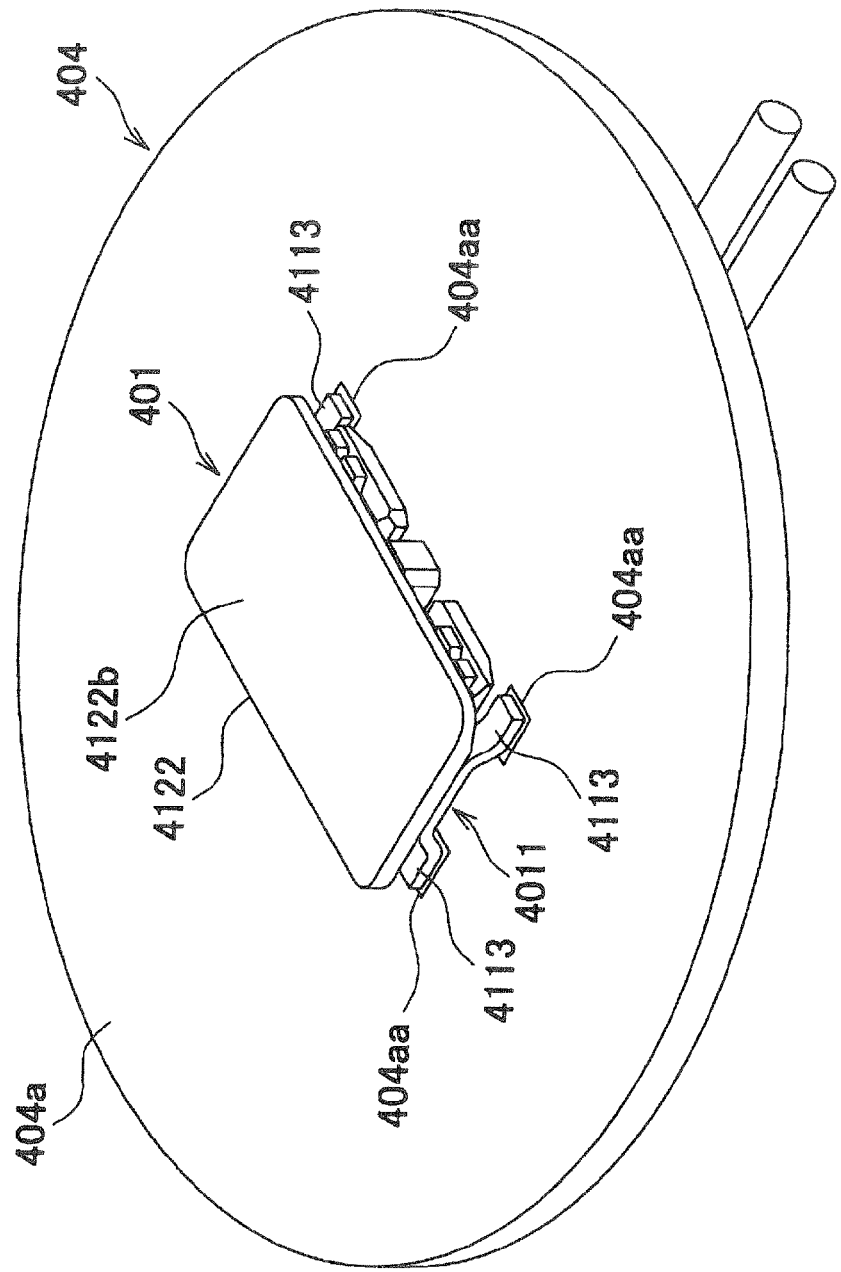
FIG. 35 is a perspective view of the connector shown in FIG. 27 mounted on the LED mounting substrate in a state in which the cable connector is connected thereto, taken obliquely from above.

As shown in FIGS. 34 and 35, when the housing main body 4121 is inserted in the hole 404b of the LED mounting substrate 404, an upper surface 4122b of the top board portion 4122 becomes substantially parallel to an upper surface 404a of the LED mounting substrate 404, a lower portion of the housing main body 4121 in a vertical direction D4 of the connector protrudes downward from a lower surface 404c of the LED mounting substrate 404, and a lower surface 4122c (see FIG. 28) of the top board portion 4122 is opposed to the upper surface 404a of the LED mounting substrate 404. When the top board portion 4122 is viewed from approximately exactly above, the contacts 4011 almost in their entirety are hidden by the top board portion 4122. When the top board portion 4122 is illuminated from approximately exactly above, the connection portions 4113 are located within an area of a projected image of the top board portion 4122 formed on a plane of projection (the upper surface 404a of the LED mounting substrate 404), and hence the connection portions 4113 are substantially hidden under the top board portion 4122.

According to the fourth embodiment, it is possible to obtain the same advantageous effects as provided by the first embodiment.

Although in the above-described embodiments, the holes 4b, 204b, and 404b are employed as the inserted portions, a cutout (not shown) may be formed in an outer periphery of the LED mounting substrate 404 in place of the hole 4b, 204b, or 404b.

It is further understood by those skilled in the art that the foregoing are the preferred embodiments of the present invention, and that various changes and modification may be made thereto without departing from the spirit and scope thereof.

DESCRIPTION OF REFERENCE NUMERALS

1, 201, 301, 401: connector
4, 404: LED mounting substrate (substrate)
4a, 404a: upper surface
4b, 204b, 404b: hole (inserted portion)
4c, 404c: lower surface
5, 205, 405: cable connector (mating connector)
303a: edge connector portion (mating connector)
11, 2011, 3011, 4011: contact
111, 2111, 3111, 4111: holding portion
112, 2112, 3112, 4112: contact portion
113, 2113, 3113, 4113: connection portion
12, 2012, 3012, 4012: housing
121, 2121, 3121, 4121: housing main body
121a, 121b, 2121a, 3121a, 4121a: connector receiving portion
121c, 2121c, 3121c, 4121c: slot
122, 2122, 3122, 4122: top board portion
122a, 2122a, 3122a, 4122a: contact accommodating portion
122b, 2122b, 3122b, 4122b: upper surface
122c, 2122c, 3122c, 4122c: lower surface
D1, D1': connector fitting direction
D2: inserting direction (predetermined direction)

The invention claimed is:

1. A connector mounted on a substrate, for being fitted to a mating connector, the connector comprising:
   a housing; and
   a contact which is inserted into and held by the housing,
   wherein the housing includes a housing main body which is inserted in an inserted portion formed in the substrate, and a top board portion formed on the housing main body;
   wherein the contact includes a plate-shaped holding portion which is inserted into the housing from a predetermined direction parallel to an upper surface of the top board portion, and is held by the housing, a contact portion which is continuous with the holding portion and extends in a connector fitting direction, and a connection portion which is continuous with the holding portion and is connected to the substrate,
   wherein the housing main body has a connector receiving portion formed therein which accommodates the contact portion and receives the mating connector,
   wherein the top board portion has a contact accommodating portion formed therein which communicates with the connector receiving portion and accommodates the holding portion,
   wherein a thickness direction of the holding portion is parallel to a thickness direction of the top board portion, the thickness direction being a smallest dimension of each of the holding and top board portions; and
   wherein the housing main body has a slot formed therein via which the contact is inserted into the connector receiving portion and the contact accommodating portion, from the predetermined direction.

2. The connector as claimed in claim 1, wherein when the top board portion is viewed from above, the contact almost in its entirety is covered by the top board portion.

3. The connector as claimed in claim 1, wherein when the housing main body is inserted in the inserted portion, the housing main body protrudes downward from a lower surface of the substrate, and a lower surface of the top board portion is opposed to an upper surface of the substrate.

4. The connector as claimed in claim 2, wherein when the housing main body is inserted in the inserted portion, the housing main body protrudes downward from a lower surface of the substrate, and a lower surface of the top board portion is opposed to an upper surface of the substrate.

5. The connector as claimed in claim 1, wherein when the housing main body is inserted in the inserted portion, the upper surface of the top board portion becomes parallel to an upper surface of the substrate.

6. The connector as claimed in claim 2, wherein when the housing main body is inserted in the inserted portion, the upper surface of the top board portion becomes parallel to an upper surface of the substrate.

7. The connector as claimed in claim 1, wherein the connector fitting direction is a direction orthogonal to the upper surface of the top board portion.

8. The connector as claimed in claim 2, wherein the connector fitting direction is a direction orthogonal to the upper surface of the top board portion.

9. The connector as claimed in claim 1, wherein the connector fitting direction is a direction parallel to the upper surface of the top board portion.

10. The connector as claimed in claim 2, wherein the connector fitting direction is a direction parallel to the upper surface of the top board portion.

11. The connector as claimed in claim 1, wherein the housing is integrally formed of a white or white based colored resin.

12. The connector as claimed in claim 2, wherein the housing is integrally formed of a white or white based colored resin.

13. A lighting device including the connector as claimed in claim 1.

14. A lighting device including the connector as claimed in claim 2.

15. A lighting device including the connector as claimed in claim 3.

16. A lighting device including the connector as claimed in claim 4.

17. A lighting device including the connector as claimed in claim 5.

18. A lighting device including the connector as claimed in claim 6.

19. A lighting device including the connector as claimed in claim 7.

20. A lighting device including the connector as claimed in claim 8.

21. A connector mounted on a substrate for being fitted to a mating connector, the connector comprising:
   a housing; and
   a contact which is inserted into and held by the housing;
   wherein the housing includes a housing main body which is inserted in an inserted portion formed in the substrate, and a top board portion which is provided to the housing main body and is disposed facing an upper surface of the substrate;
   wherein the contact includes a holding portion which is inserted into the housing from a predetermined direction parallel to an upper surface of the top board portion, and is held by the housing, a contact portion which is continuous with the holding portion and extends in a connector fitting direction, and a connection portion which is continuous with the holding portion and is soldered to the upper surface of the substrate,
   wherein the housing main body has a connector receiving portion formed therein which accommodates the contact portion and receives the mating connector,
   wherein the top board portion has a contact accommodating portion formed therein which communicates with the connector receiving portion and accommodates the holding portion, and
   wherein the housing main body has a slot formed therein via which the contact is inserted into the connector receiving portion and the contact accommodating portion, from the predetermined direction.

22. The connector as claimed in claim 21, wherein when the top board portion is viewed from above, the contact almost in its entirety is covered by the top board portion.

23. The connector as claimed in claim 21, wherein when the housing main body is inserted in the inserted portion, the housing main body protrudes downward from a lower surface of the substrate, and a lower surface of the top board portion is opposed to the upper surface of the substrate.

24. The connector as claimed in claim 22, wherein when the housing main body is inserted in the inserted portion, the housing main body protrudes downward from a lower surface of the substrate, and a lower surface of the top board portion is opposed to the upper surface of the substrate.

25. The connector as claimed in claim 21, wherein when the housing main body is inserted in the inserted portion, the upper surface of the top board portion becomes parallel to the upper surface of the substrate.

26. The connector as claimed in claim 22, wherein when the housing main body is inserted in the inserted portion, the upper surface of the top board portion becomes parallel to the upper surface of the substrate.

27. The connector as claimed in claim 21, wherein the connector fitting direction is a direction orthogonal to the upper surface of the top board portion.

28. The connector as claimed in claim 22, wherein the connector fitting direction is a direction orthogonal to the upper surface of the top board portion.

29. The connector as claimed in claim 21, wherein the connector fitting direction is a direction parallel to the upper surface of the top board portion.

30. The connector as claimed in claim 22, wherein the connector fitting direction is a direction parallel to the upper surface of the top board portion.

31. The connector as claimed in claim 21, wherein the housing is integrally formed of a white or white based colored resin.

32. The connector as claimed in claim 22, wherein the housing is integrally formed of a white or white based colored resin.

33. A lighting device including the connector as claimed in claim 21.

34. A lighting device including the connector as claimed in claim 22.

35. A lighting device including the connector as claimed in claim 23.

36. A lighting device including the connector as claimed in claim 24.

37. A lighting device including the connector as claimed in claim 25.

38. A lighting device including the connector as claimed in claim 26.

39. A lighting device including the connector as claimed in claim 27.

40. A lighting device including the connector as claimed in claim 28.

* * * * *

UNITED STATES PATENT AND TRADEMARK OFFICE
CERTIFICATE OF CORRECTION

PATENT NO.        : 8,870,588 B2
APPLICATION NO.   : 13/510703
DATED             : October 28, 2014
INVENTOR(S)       : Takaaki Kudo et al.

Page 1 of 1

It is certified that error appears in the above-identified patent and that said Letters Patent is hereby corrected as shown below:

On the Title page, Item (57) Abstract, Line 8:

delete "hoard" and insert --board--.

Signed and Sealed this
Twenty-second Day of December, 2015

Michelle K. Lee
*Director of the United States Patent and Trademark Office*